(12) United States Patent
Vail et al.

(10) Patent No.: US 6,247,197 B1
(45) Date of Patent: Jun. 19, 2001

(54) BRUSH INTERFLOW DISTRIBUTOR

(75) Inventors: Jim Vail, Santa Cruz; Mike Wallis, Corralitos, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/112,666

(22) Filed: Jul. 9, 1998

(51) Int. Cl.[7] .................................. B08B 1/04; B08B 3/00
(52) U.S. Cl. .................................. 15/77; 15/24; 15/88.3; 15/102; 15/103.5; 118/259; 118/266; 118/DIG. 15; 401/197; 192/17; 192/29; 192/49
(58) Field of Search ..................... 401/197; 492/17, 492/29–31, 33, 36, 46, 49; 118/258, 259, 264, 266, DIG. 14, DIG. 15; 15/21.1, 77, 88.3, 97.1, 102, 179, 24, 230, 230.1, 230.16, 230.18, 103.5

(56) References Cited

U.S. PATENT DOCUMENTS

| | | | |
|---|---|---|---|
| 2,563,048 | * | 8/1951 | Liebelt et al. ................ 401/197 |
| 2,563,049 | * | 8/1951 | Liebelt et al. ................ 401/197 |
| 2,565,743 | * | 8/1951 | Schaefer ..................... 401/197 |
| 2,606,334 | * | 8/1952 | Vaden et al. ................. 401/197 |
| 2,889,696 | * | 6/1959 | Lynch ....................... 492/17 X |
| 3,826,581 | * | 7/1974 | Henderson .................. 401/197 X |
| 4,062,463 | | 12/1977 | Hillman et al. .................. 15/77 |
| 4,202,071 | | 5/1980 | Scharpf ....................... 15/302 |
| 4,382,308 | | 5/1983 | Curcio .......................... 15/77 |
| 4,461,052 | | 7/1984 | Mostul ......................... 15/29 |
| 4,569,695 | | 2/1986 | Yamashita et al. ............... 134/1 |
| 5,081,733 | | 1/1992 | Kudo .......................... 15/77 |
| 5,317,778 | | 6/1994 | Kudo et al. ................... 15/88.3 |
| 5,442,828 | | 8/1995 | Lutz ......................... 15/88.3 |
| 5,475,889 | | 12/1995 | Thrasher et al. .............. 15/88.3 |
| 5,518,552 | | 5/1996 | Tanoue et al. .................. 134/1 |
| 5,529,638 | | 6/1996 | Lutz ........................... 134/6 |
| 5,555,177 | | 9/1996 | Simmons .................... 364/468.28 |
| 5,581,837 | | 12/1996 | Uchiyama et al. ................ 15/77 |
| 5,606,251 | | 2/1997 | Ryle et al. ................. 324/158.1 |
| 5,624,501 | | 4/1997 | Gill, Jr. ....................... 134/6 |
| 5,639,311 | | 6/1997 | Holley et al. .................... 134/6 |
| 5,675,856 | | 10/1997 | Itzkowitz ...................... 15/77 |
| 5,693,148 | | 12/1997 | Simmons et al. ................ 134/18 |
| 5,723,019 | | 3/1998 | Krussell et al. .................. 134/6 |
| 5,727,332 | | 3/1998 | Thrasher et al. ................. 34/277 |
| 5,745,946 | | 5/1998 | Thrasher et al. ................. 15/77 |
| 5,778,554 | | 7/1998 | Jones ........................... 34/58 |
| 5,806,126 | | 9/1998 | de Larios et al. ............... 15/102 |
| 5,875,507 | * | 3/1999 | Stephens et al. ................ 15/102 |

FOREIGN PATENT DOCUMENTS

| | | |
|---|---|---|
| 448290 | 8/1927 | (DE) . |
| 674645 | 4/1939 | (DE) . |
| 0 526 245 | 2/1993 | (EP) . |
| 1035235 * | 4/1953 | (FR) ................... 401/197 |
| 59-086226 | 5/1984 | (JP) . |
| 59-193029 | 11/1984 | (JP) . |
| 6-163491 | 6/1994 | (JP) . |
| 271795 | 11/1967 | (SU) . |
| 97/13590 | 4/1997 | (WO) . |

\* cited by examiner

*Primary Examiner*—Mark Spisich
(74) *Attorney, Agent, or Firm*—Martine Penilla & Kim, LLP

(57) ABSTRACT

A brush assembly includes a distributor having a slot matrix formed in an outer surface of the distributor, the slot matrix including a plurality of longitudinal slots intersecting a plurality of annular slots. The brush assembly further includes a housing having an inner surface abutting the outer surface of the distributor, a brush mounted on the housing and a shaft. During use, the flow of liquid from the shaft to the housing flows through the longitudinal slots and annular slots of the distributor. By appropriately selecting the dimensions and numbers of these slots, the flow of liquid from the shaft to the housing is readily redistributed. For example, the flow of liquid is redistributed to provide a greater amount of liquid to the ends of the brush than to the center of the brush.

18 Claims, 16 Drawing Sheets

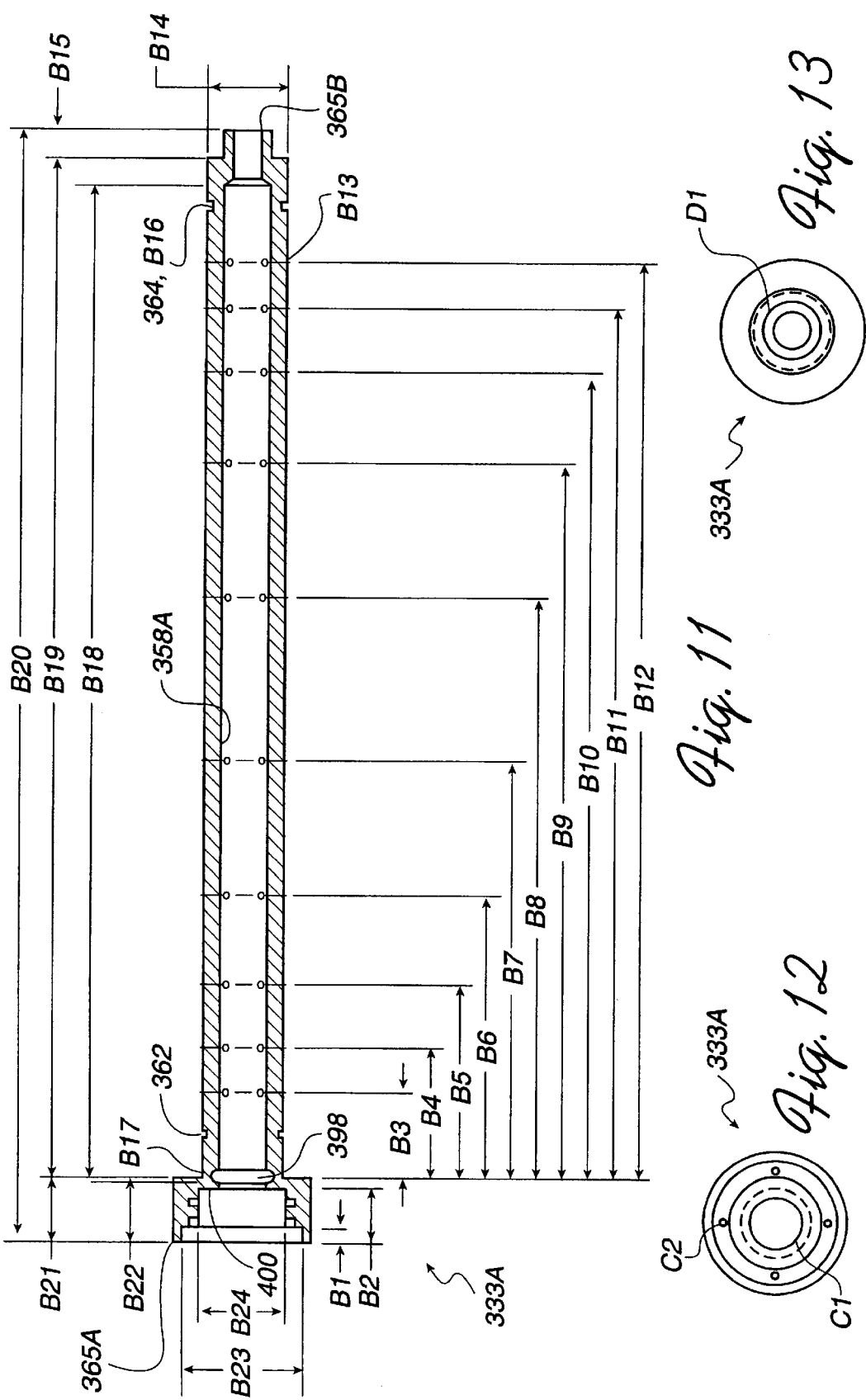

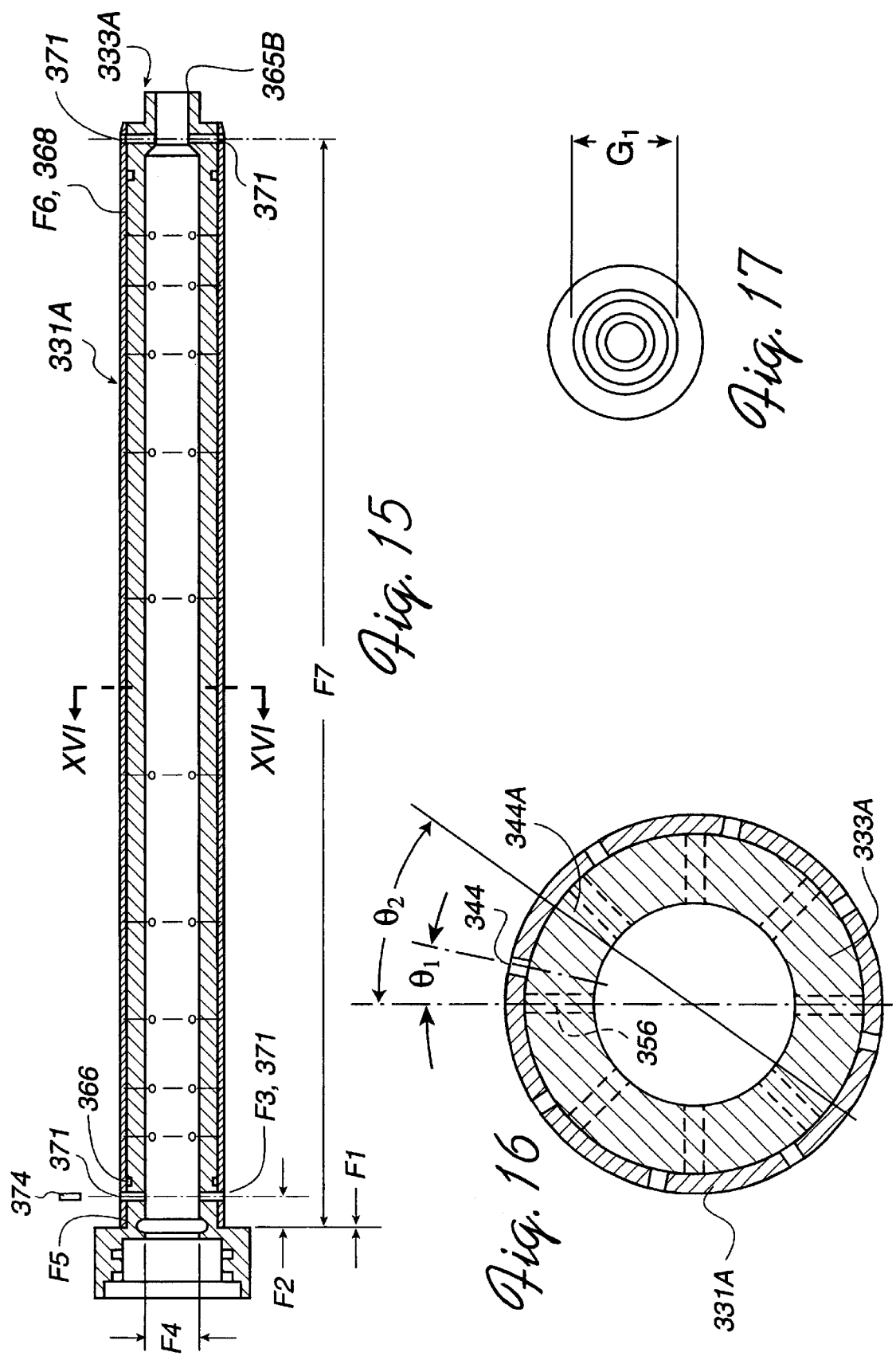

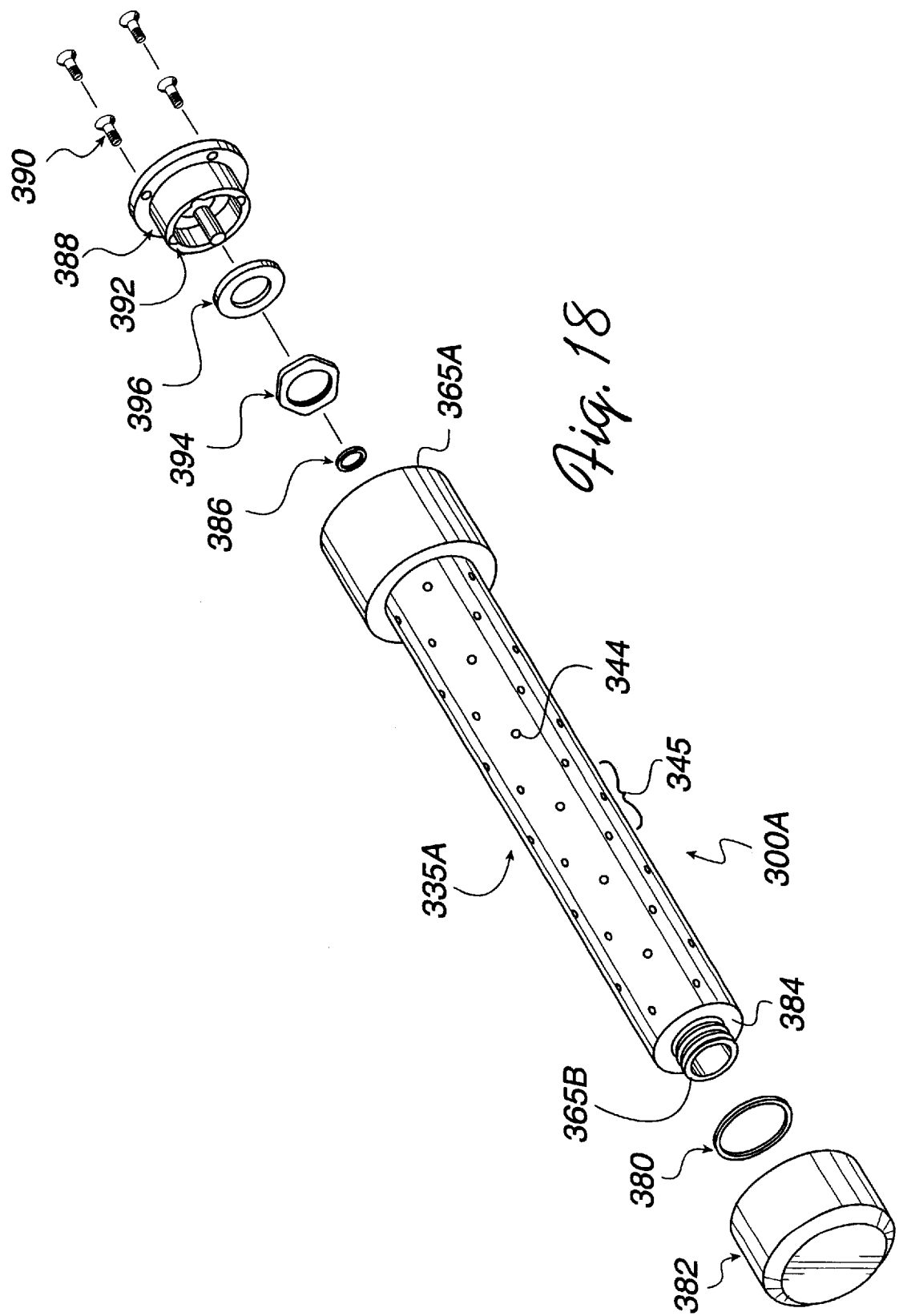

BRUSH INTERFLOW DISTRIBUTOR

FIELD OF THE INVENTION

The present invention relates generally to semiconductor processing and more particularly to a brush assembly for cleaning wafers.

BACKGROUND OF THE INVENTION

Semiconductor manufacturing processes demand wafers, typically silicon wafers, which are substantially particulate free. As the semiconductor industry moves towards processing larger diameter wafers, for example 300 mm diameter wafers, it becomes increasingly difficult to remove particulates from the wafers. In particular, wafer cleaning processes must effectively remove particulates from the larger wafer surface area associated with the larger diameter wafers. Further, wafer cleaning processes must clean the wafers without exerting undue force on the wafers since larger diameter wafers have less mechanical strength than smaller diameter wafers.

SUMMARY OF THE INVENTION

In accordance with the present invention, a brush assembly includes a distributor having a slot matrix formed in an outer surface of the distributor, the slot matrix including a plurality of longitudinal slots intersecting a plurality of annular slots. The distributor is mounted on a hollow shaft having a plurality of perforations. The brush assembly further includes an outer housing having an inner surface abutting the outer surface of the distributor and a brush mounted on the housing.

During use, liquid flows from inside of the shaft through the shaft perforations to the distributor. The liquid then flows through a plurality of perforations in the distributor, one perforation being located in each longitudinal slot between adjacent annular slots. After flowing through the perforations in the distributor, the liquid flows through the longitudinal slots to the annular slots. The liquid then flows through the annular slots in the distributor to and through annular columns of perforations in the housing. The liquid flowing through the annular columns of perforations in the housing flushes the brush from the inside out.

Of importance, the flow of liquid from the shaft to the housing is readily controlled by appropriately selecting the dimensions of the longitudinal slots and annular slots in the distributor through which the liquid must flow. Generally, increasing the cross-sectional area and, to a lesser extent, decreasing the length of a slot increases the flow of liquid through the particular slot and vice versa. Thus, the flow of liquid from the shaft to the housing is readily controlled (restricted) by selecting the cross-sectional area of the longitudinal slots and annular slots of the distributor. As an illustration, a first distributor having longitudinal slots and annular slots with greater cross-sectional areas than those of a second distributor will allow a greater amount of liquid to flow from the shaft to the housing than the second distributor.

In one embodiment, the annular slots are formed closer together near the ends of the brush than in the center of the brush. As a result, a greater amount of liquid is provided to the ends of the brush than to the center. This is a particular advantage in wafer cleaning operations where a greater effective wafer surface area near the ends of the brush must be cleaned.

The distributor also restricts the liquid flow from the shaft to the housing. This allows the number of perforations in the housing to be increased without significantly increasing the overall amount of liquid used. This is particularly advantageous since increasing the number of perforations in the housing reduces localized nonuniform flushing of the brushes. Further, by restricting the flow of liquid, the distributor causes a uniform pressure buildup inside of the distributor. This, in turn, ensures that both ends of the brush receive the same amount of liquid and are uniformly flushed which improves particulate removal from the brush and reduces or eliminates uneven wear of the brush.

In accordance with the present invention, a method of removing particulates from a brush is provided. The method includes creating a liquid flow from a shaft to a housing, the brush being mounted on the housing. This liquid flow is redistributed by a distributor. In one embodiment, the liquid flow is redistributed to restrict the flow of liquid. In another embodiment, the liquid flow is redistributed to cause a greater amount of the liquid flow to flush the ends of the brush than the center of the brush.

These and other objects, features and advantages of the present invention will be more readily apparent from the detailed description of the various embodiments set forth below taken in conjunction with the accompanying drawings.

BRIEF DESCRIPTION OF THE DRAWINGS

FIG. 11 is a cross-sectional view of the distributor of FIG. 10 in accordance with this embodiment of the present invention.

FIGS. 12 and 13 are end plan views of the distributor of FIG. 10 in accordance with this embodiment of the present invention.

FIG. 15 is a cross-sectional view of the housing of FIG. 14 mounted on the distributor of FIGS. 10–13 in accordance with this embodiment of the present invention.

FIG. 16 is a cross-sectional view of the housing and distributor along the line XVI—XVI of FIG. 15 in accordance with this embodiment of the present invention.

FIG. 17 is an end plan view of the housing and distributor of FIG. 15 in accordance with this embodiment of the present invention.

FIG. 18 is an exploded perspective view of a brush assembly without a brush in accordance with this embodiment of the present invention.

DETAILED DESCRIPTION

Several elements shown in the following Figures are substantially similar. Therefore, similar reference numbers are used to represent similar elements.

Figure 1:
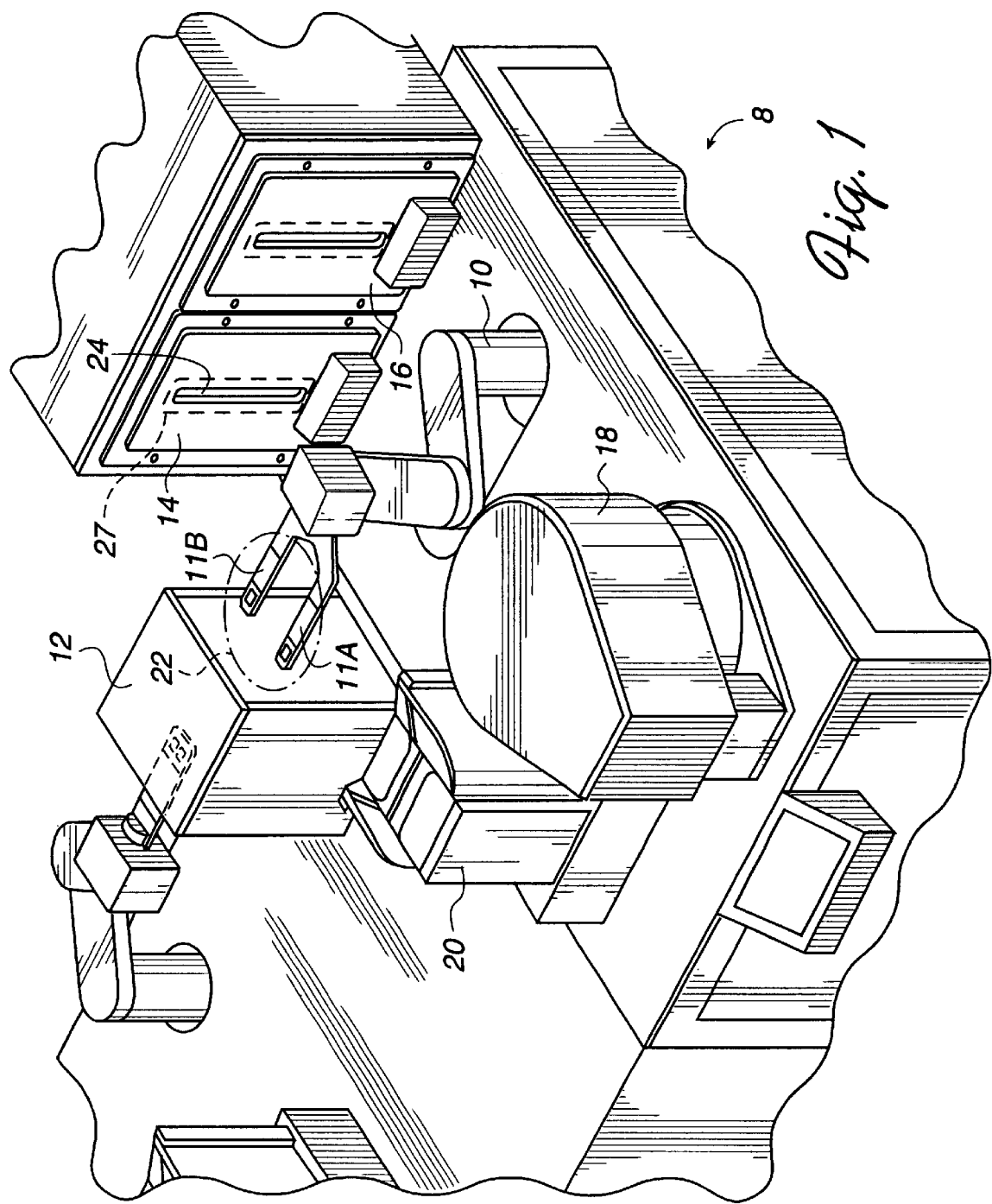
FIG. 1 is a perspective view of wafer cleaning system including a pair of wafer cleaners.

FIG. 1 is a perspective view of wafer cleaning system 8 including wafer cleaners 14, 16. Wafer cleaning system 8 includes a robotic arm 10, a wet buffer unit 12, wafer cleaners 14, 16, a spin drying unit 18, and a finish cassette 20.

Robotic arm 10 has an end-effector 11 which uses a vacuum to hold a wafer. End-effector 11 can be rotated from the horizontal position in which arm 11A is located horizontally from arm 11B, as shown in FIG. 1, to a vertical position in which arm 11A is located above arm 11B. Wet buffer unit 12 includes a plurality of horizontal slots in which to hold wafers. Typically, wet buffer unit 12 has sprayers which spray liquid on the wafers to keep the wafers wet from previous wafer processing, such as wafer polishing. Wafer cleaners 14 and 16, which are described in detail below, are substantially identical with the exception, in this example, that a different scrubbing solution is used in wafer cleaner 14 than in wafer cleaner 16. Spin drying unit 18 dries the wafer by spinning the wafer at high speeds, thereby removing any liquid from the surface of the wafer. Spin drying unit 18 is further described in Jones, application Ser. No. 08/680,739, filed Jul. 15, 1996, U.S. Pat. No. 5,778,554 herein incorporated by reference in its entirety. Finish cassette 20 has a plurality of slots for holding the finished wafers.

During use, robotic arm 10 removes a wafer which is oriented horizontally from wet buffer unit 12 (the perimeter 22 of the wafer as it is removed from wet buffer unit 12 is indicated in FIG. 1). Robotic arm 10 then rotates the wafer 90° to a vertical orientation and inserts the wafer into vertical slot 24 of wafer cleaner 14. After processing of the wafer in wafer cleaner 14 (described below), robotic arm 10 removes the wafer from wafer cleaner 14 through slot 24. This sequence is repeated with wafer cleaner 16. The wafer is then rotated 90° by robotic arm 10. The wafer is then loaded horizontally into spin drying unit 18 and finally is loaded from spin drying unit 18 to finish cassette 20.

Figure 2:
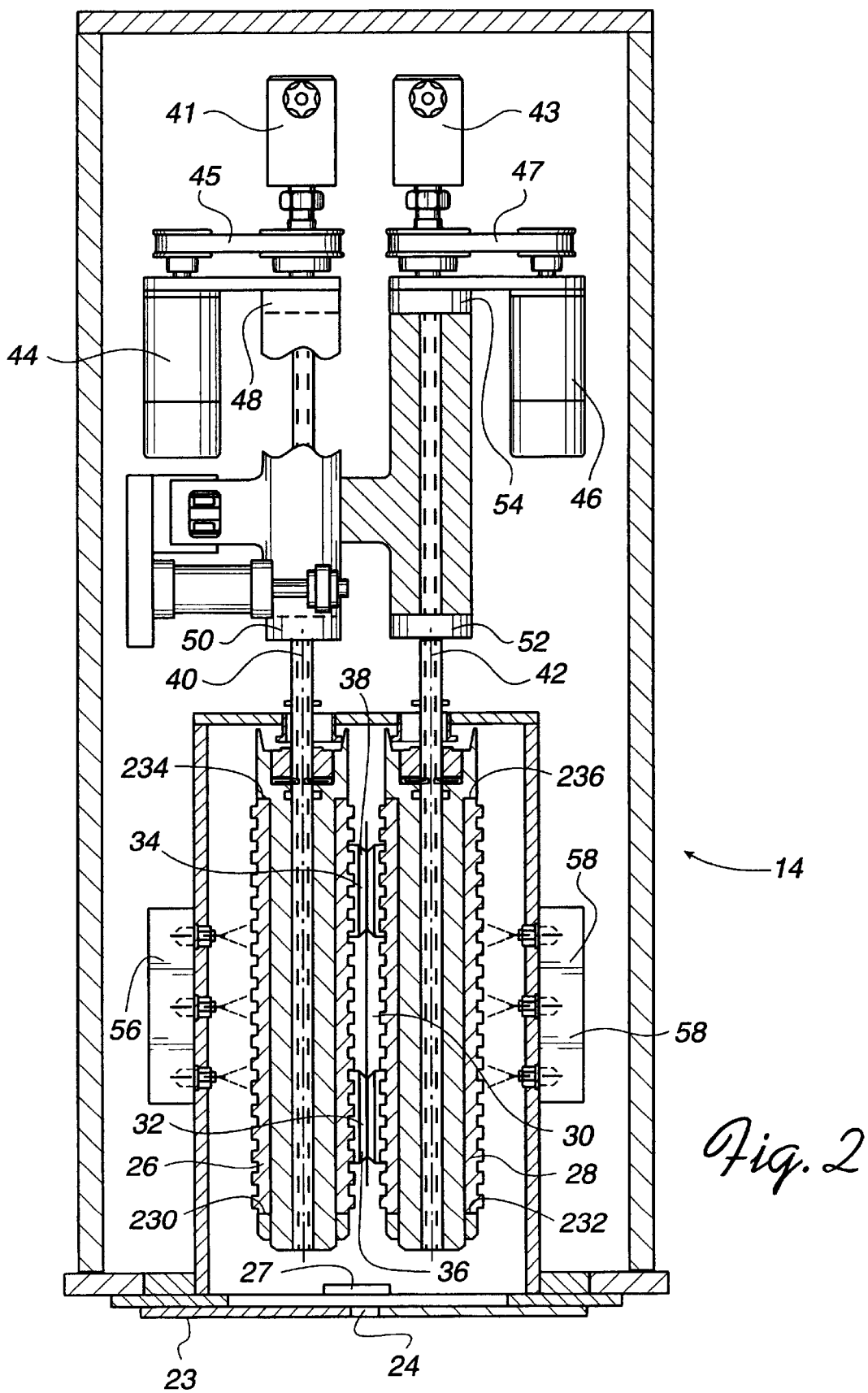
FIG. 2 is a partial top view of one of the wafer cleaners.

FIG. 2 is a partial top view of wafer cleaner 14. As shown, wafer cleaner 14 includes a housing 23 which includes slot 24 through which a wafer is inserted into wafer cleaner 14. Slot 24 is fitted with a door 27 which opens and closes slot 24. Wafer cleaner 14 further includes a first rotary brush 26 and a second rotary brush 28. Brushes 26, 28 are made of polyvinyl alcohol (PVA) foam although other materials such as nylon, mohair or a mandrel wrapped with polishing pad material can be used. In one embodiment, brushes 26, 28 are PVA foam manufactured by KANEBO of Japan. Brushes 26, 28 are located horizontally from one another.

Located between brushes 26, 28, and defined by brushes 26, 28, is a region 30. Located vertically below region 30 is a first roller 32 and a second roller 34. Rollers 32, 34 have V-grooves 36, 38, respectively, extending around the periphery of the rollers.

Brushes 26, 28 are mounted to first ends of shafts 40, 42, respectively. Rotary unions 41, 43 are mounted to second ends of shafts 40, 42, respectively. Shafts 40, 42 have central cavities formed therein which allow liquid to flow from rotary unions 41, 43 through shafts 40, 42, respectively. Further, shafts 40, 42 have perforations in the regions of shafts 40, 42 to which brushes 26, 28, respectively, are mounted. The perforations allow liquid to be distributed from shafts 40, 42 to brushes 26, 28.

Wafer cleaner 14 further includes a plurality of spray nozzles. In particular, located proximate to and above brush 26 is a first set of spray nozzles 56. Similarly, located proximate to and above brush 28 is a second set of spray nozzles 58. During use, first and second sets of spray nozzles 56, 58, spray liquid towards a wafer located between brushes 26, 28, respectively. In one embodiment, first and second sets of spray nozzles 56, 58, each comprise three individual spray nozzles, although other numbers of spray nozzles can be used, e.g. four.

Servo motors 44, 46 are connected to pulleys on the second ends of shafts 40, 42 by drive belts 45, 47, respectively. Shaft 40 is mounted into bearings 48 and 50. Similarly, shaft 42 is mounted into bearings 52 and 54.

Figure 3:
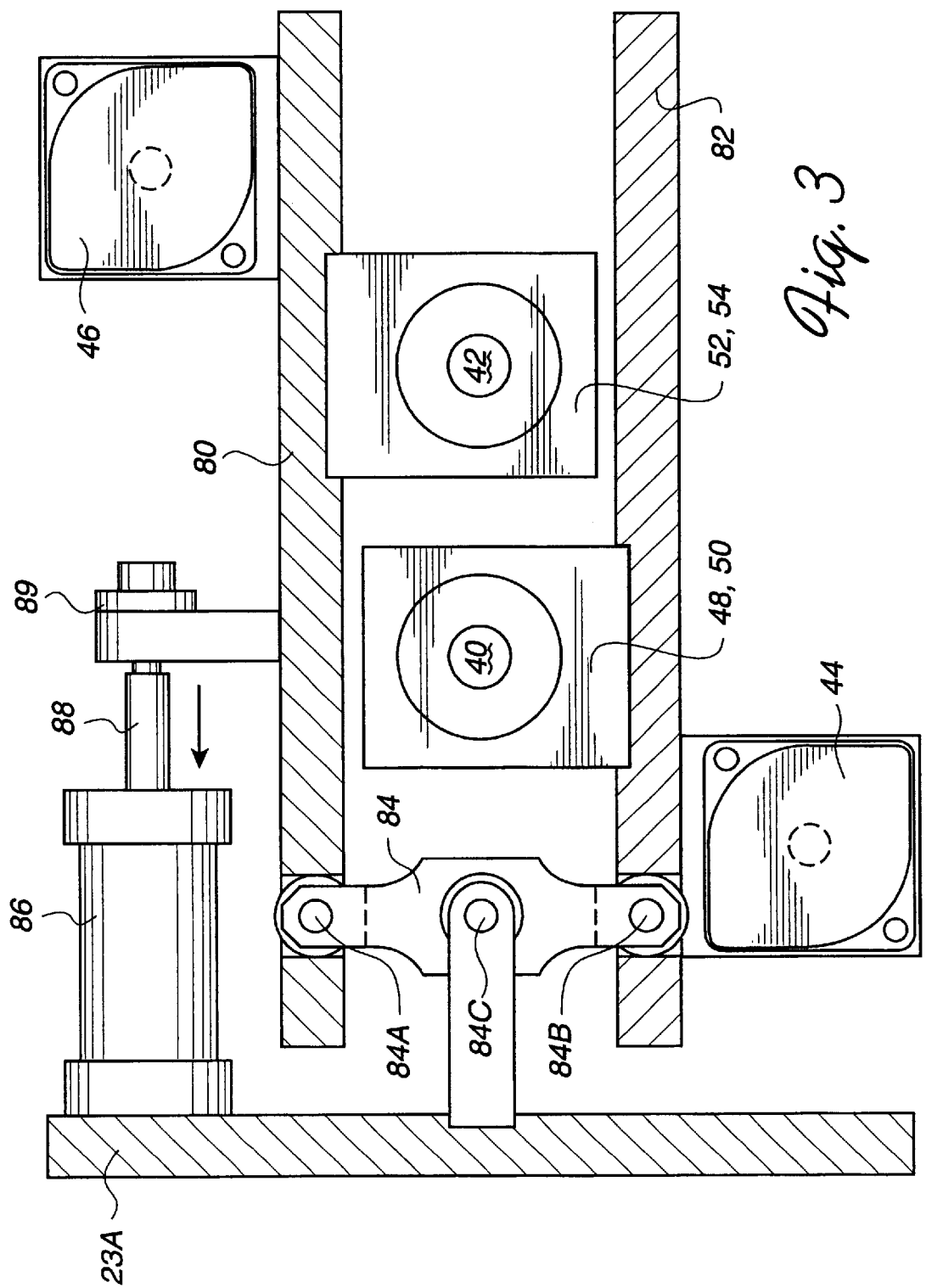
FIG. 3 is a partial frontal view of the wafer cleaner.

FIG. 3 is a partial front view of wafer cleaner 14. As shown in FIG. 3, bearings 52, 54 are mounted to an upper movable plate 80. Bearings 48, 50 are mounted to a lower movable plate 82. Motors 46, 44 are also mounted to movable plates 80, 82, respectfully. During use, motors 44, 46 rotate shafts 40, 42 in opposite directions, thereby rotating brushes 26, 28 in opposite directions, respectively. Generally, brushes 26, 28 are rotated between 50 to 1500 revolutions per minute.

Further, upper plate 80 is coupled to a first end 84A of a pivot 84 and lower plate 82 is coupled to a second end 84B of pivot 84. Pivot 84 is coupled at its center 84C to a section 23A of housing 23 (or alternatively to a plate 23A connected to housing 23). Also coupled to section 23A is an air cylinder 86. Air cylinder 86 has a piston 88 coupled by a pressure transducer 89 to upper plate 80.

By controlling pressurized air flow into and out of air cylinder 86, the position of piston 88 can be controlled, and hence the position of brushes 26, 28 can be controlled. In particular, when piston 88 is partially extended as in FIG. 3, brushes 26, 28 are located at a distance from one another. However, when piston 88 is retracted into air cylinder 86 (moved in the direction towards section 23A as indicated by the arrow in FIG. 3), upper plate 80 is also moved towards section 23A. Since shaft 42 is mounted to upper plate 80, shaft 42 and brush 28 are also moved towards section 23A.

The movement of upper plate 80 towards section 23A causes first end 84A of pivot 84 to also move towards section 23A. Since pivot 84 is coupled at its center 84C to section 23A, the motion of first end 84A causes an equal and opposite motion of second end 84B of pivot 84. Thus, as upper plate 80 moves towards section 23A, lower plate 82 moves away from section 23A. Since shaft 40 is mounted to lower plate 82, shaft 40 and brush 26 are also moved away from section 23A. The net result is that when piston 88 is retracted, brushes 26, 28 are moved towards one another and when piston 88 is extended (moved away from section 23A), brushes 26, 28 are moved away from one another. Further, the pivot 84 ensures that the perpendicular component of force (further described below) of each brush (26, 28) is equal and opposite to that of the other brush (28, 26).

Figure 4:
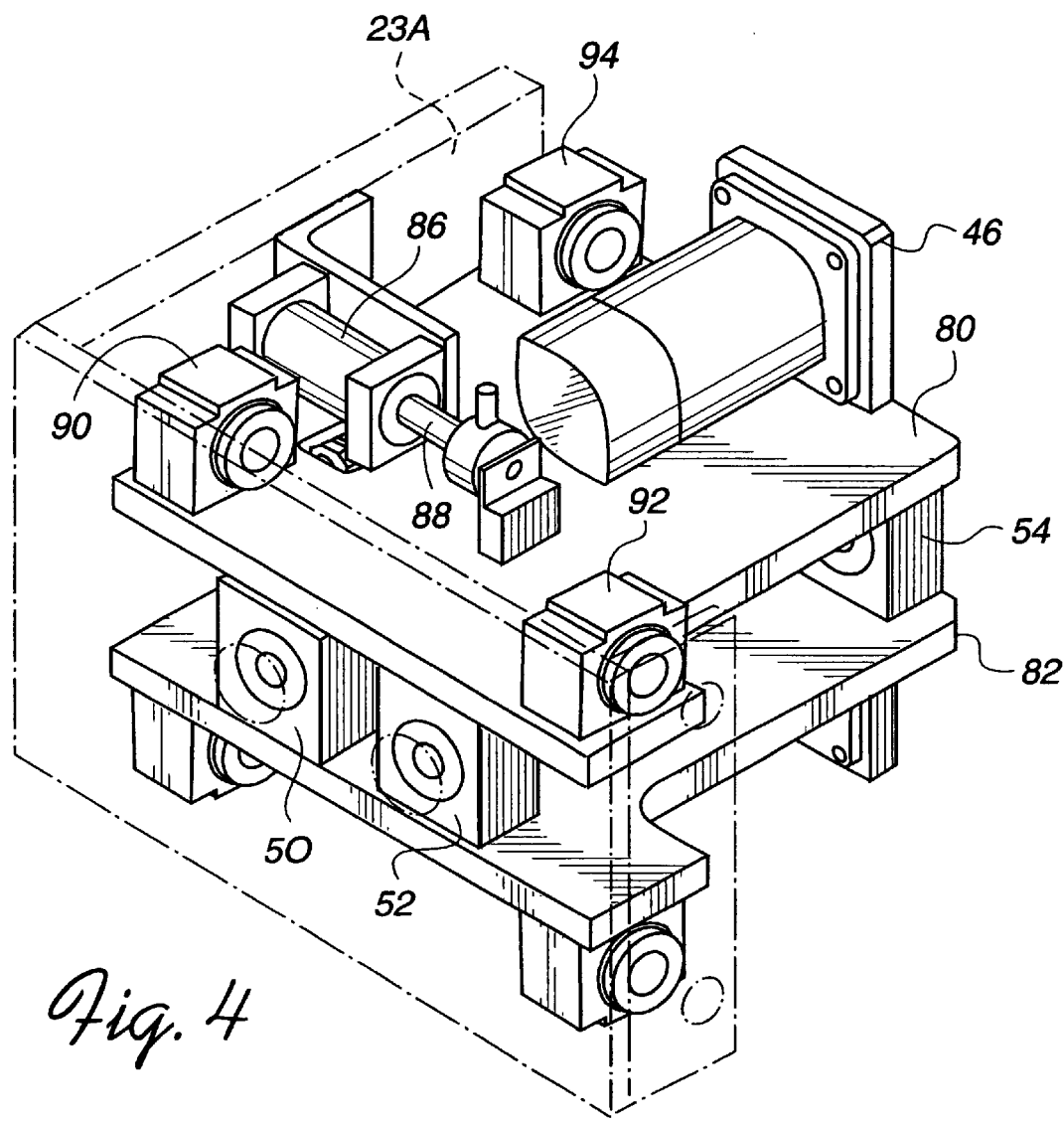
FIG. 4 is a partial perspective view of the wafer cleaner.

FIG. 4 is a partial perspective view of wafer cleaner 14. As shown in FIG. 4, mounted to upper plate 80 are bearings 90, 92 and 94. Running through bearings 90, 92 is a first immobilized shaft and running through bearing 94 is a second immobilized shaft (these shafts are not illustrated in FIG. 4 for purposes of clarity). As piston 88 of air cylinder 86 is extended and retracted and upper plate 80 moved, upper plate 80 slides along the shafts running through bearings 90, 92, and 94. In this manner, plate 80 is prevented from moving in any direction except perpendicular to the plane of section 23A. Similar bearings and shafts are mounted to plate 82 which also prevent plate 82 from moving in any direction except perpendicular to the plane of section 23A.

Figure 5:
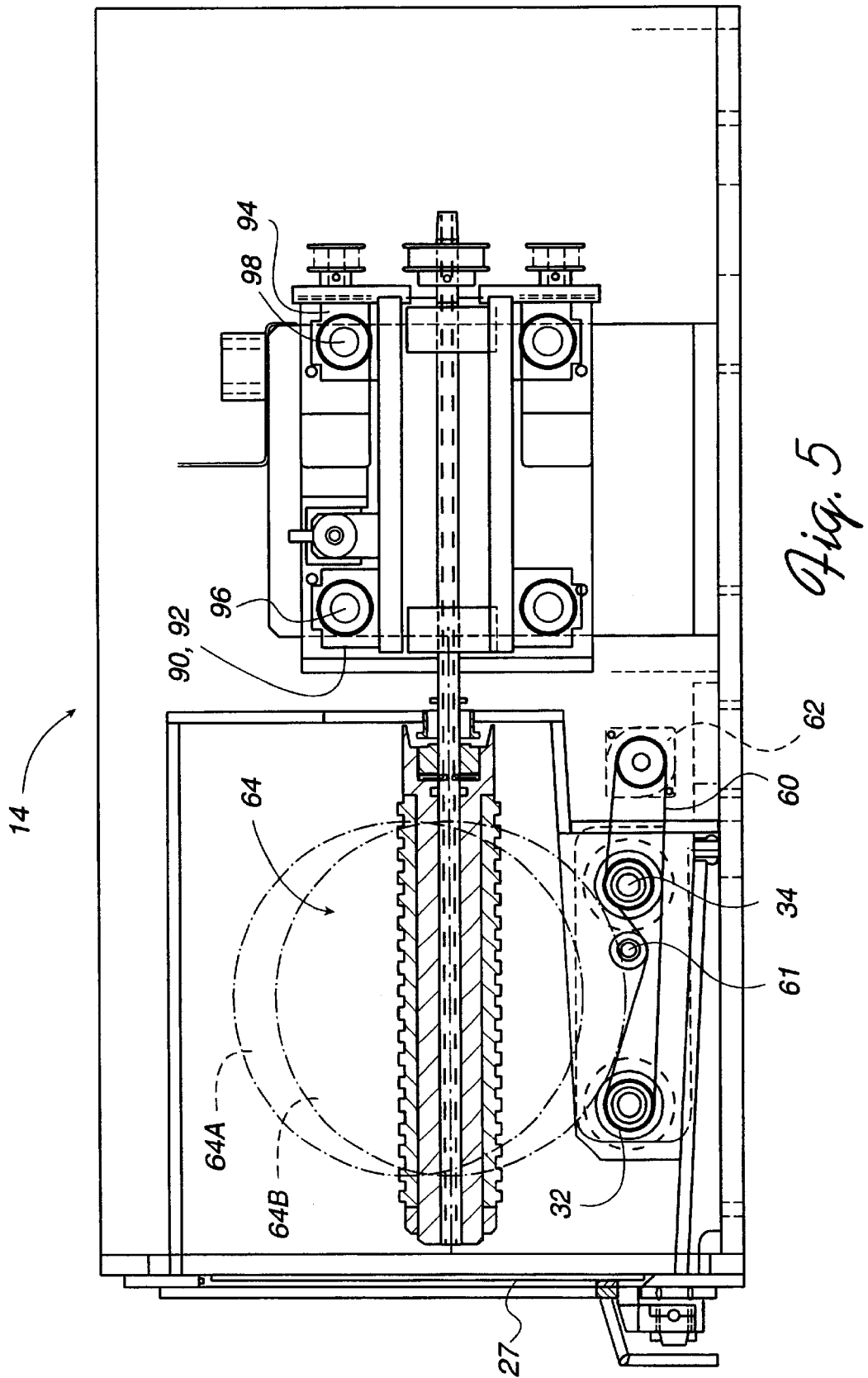
FIG. 5 is a partial side view of the wafer cleaner.

FIG. 5 is a partial side view of wafer cleaner 14. As shown in FIG. 5, a drive belt 60 couples rollers 32, 34 to roller motor 62. An idler pulley 61 maintains a proper tension in drive belt 60. During use, motor 62 causes drive belt 60 to move thereby rotating rollers 32, 34. Also shown in FIG. 5 are shafts 96 and 98 which run through bearings 90, 92 and 94, respectively.

Figure 6:
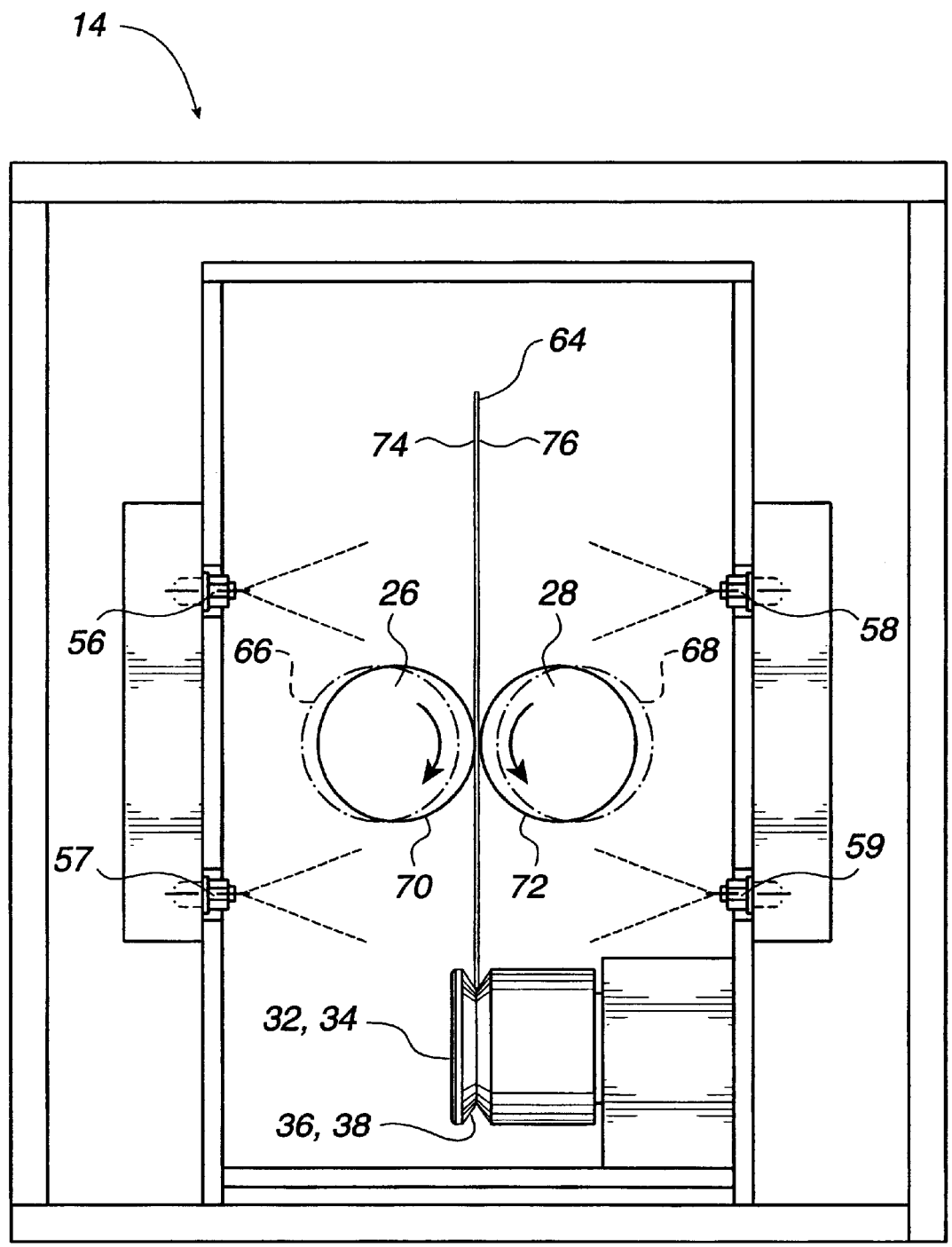
FIG. 6 is a frontal view of wafer cleaner during use in accordance with the present invention.

FIG. 6 is a partial frontal view of wafer cleaner 14 during use. As shown in FIG. 6, initially brushes 26, 28 are at positions 66, 68, respectively (indicated by phantom circles). Wafer 64 is then inserted vertically through slot 24 into region 30 by robotic arm 10 (not shown). While the wafer is held by end-effector 11 (not shown), brushes 26, 28 are moved towards each other to positions 70, 72, respectively. Typically, brushes 26, 28 travel approximately 0.5 inches between positions 66 and 70, 68 and 72, respectively. At positions 70, 72, brushes 26, 28 contact first and second surfaces 74, 76, respectively, of wafer 64. The perpendicular component of force (force exerted perpendicular to planes formed by surfaces 74, 76 of wafer 64) exerted by brush 26 (and brush 28) on to wafer 64 is measured and controlled. For example, by measuring and controlling the force exerted by piston 88 on pressure transducer 89 (FIG. 3), the perpendicular component of force exerted by brushes 26, 28 on to wafer 64 is measured and controlled. Generally, the perpendicular component of force exerted by each brush on wafer 64 is less than 50 pounds per square inch (PSI) and preferably is 5 PSI.

End-effector 11 then releases wafer 64, robotic arm 10 removes end-effector 11 from wafer cleaner 14 and door 27 over slot 24 is closed. As best seen in FIG. 5, wafer 64 is held by brushes 26, 28 at a first position 64A. Brushes 26, 28 are then caused to rotate by servo motors 44, 46 (FIGS. 2, 3), respectively. Servo motors 44, 46 rotate brushes 26, 28 at substantially the same speed. As shown in FIG. 6, brush 26 is rotated clockwise and brush 28 is rotated counterclockwise. This rotation of brushes 26, 28, forces wafer 64 (to a position 64B in FIG. 5) into V-grooves 36, 38 of rollers 32, 34, respectively. This engages wafer 64 to rollers 32, 34. Motor 62 then causes rollers 32, 34 to rotate which, in turn, cause wafer 64 to rotate. Generally, the wafer is rotated at less than 500 RPM.

Referring back to FIG. 6, brushes 26, 28 are then flushed from the inside out by liquid supplied to brushes 26, 28 from shafts 40, 42. Substantially simultaneously, first and second sets of spray nozzles 56, 58, spray liquid on brush 26, first surface 74 of disk 64 and brush 28, second surface 76 of disk 64, respectively.

In one embodiment, wafer cleaner 14 further includes third and fourth sets of spray nozzles 57, 59 located below first and second sets of spray nozzles 56, 58, respectively. During a first stage of the wafer cleaning cycle, a first liquid is sprayed from sets of spray nozzles 57, 59 (or 56, 58). During a second stage of the wafer cleaning cycle, a second liquid is sprayed from sets of spray nozzles 56, 58 (or 57, 59). For example, the first liquid can be a surfactant and the second liquid can be de-ionized water. Alternatively, the same liquid can be sprayed from sets of spray nozzles 56, 57, 58, 59 simultaneously. Further, additional liquids can be sprayed during various stages of the wafer cleaning cycle by adding additional sets of spray nozzles.

Alternatively, only first and second sets of spray nozzles 56, 58 are used, but individual nozzles of each of the sets of spray nozzles are plumbed to different liquids. In this manner, selective nozzles can spray different liquids at various stages in the wafer cleaning cycle.

The flow of liquid to brushes 26, 28 and first and second sets of spray nozzles 56, 58 is controlled by opening and closing valves coupled to feed lines (not shown) which are plumbed to shafts 40, 42 via rotary unions 41, 43, respectively and sets of spray nozzles 56, 58. Further, the operation of wafer cleaner 14 is controlled by a conventional programmable logic controller (PLC), for example by a PLC model #2600 manufactured by Control Technology Corp. located in Hopkinton, Mass.

The combination of the scrubbing action on the surfaces 74, 76 of wafer 64 caused by the rotation of brushes 26, 28 along with liquid supplied through brushes 26, 28 and by sets of spray nozzles 56, 58, removes particulates from surfaces 74, 76 of wafer 64. In particular, particulates are scrubbed from surfaces 74, 76 by brushes 26, 28, respectively. These particulates are flushed from brushes 26, 28 by the liquid supplied to brushes 26, 28 through shafts 40, 42.

Further, particulates which are loosened by the scrubbing action of brushes 26, 28, but remain on surfaces 74, 76 of wafer 64, are flushed from surfaces 74, 76 by liquid sprayed from sets of spray nozzles 56, 58. By orienting wafer 64 vertically instead of horizontally, the removal of particulates from the surfaces 74, 76 is enhanced. In particular, by orienting wafer 64 vertically, liquid sprayed on to surfaces 74, 76 of wafer 64 and particulates trapped in the liquid have a tendency to fall from surfaces 74, 76 due to gravity. In contrast, if wafer 64 were oriented horizontally, particulates would tend to be moved around on surfaces 74, 76 and would not be as readily removed. Thus, wafer cleaner 14 is particularly well suited for larger diameter wafers in which particulates must be removed from a larger surface area. For example, wafer cleaner 14 is particularly well suited for cleaning 200 mm and 300 mm diameter wafers.

Further, by orienting wafer 64 vertically and by scrubbing both surfaces 74, 76 simultaneously, mechanical stress on wafer 64 is minimized. This is because the perpendicular component of the force exerted by brush 26 on wafer 64 is offset by the perpendicular component of the force exerted by brush 28 on wafer 64. (The perpendicular components of force exerted by each brush of the wafer is equal and opposite to that of the other brush.) Thus, the net force which is exerted on wafer 64 by brushes 26, 28 is substantially parallel to the plane formed by surface 74 (or surface 76). Since wafer 64 has the greatest mechanical strength in this plane, wafer cleaner 14 is well suited for larger diameter disks. (Larger diameter disks generally flex when force is exerted in a plane perpendicular to side 74.)

After wafer 64 has been scrubbed for a predetermined period of time, generally 30 to 120 seconds and typically 45 seconds, the flow of liquid to brushes 26, 28 and sets of spray nozzles 56, 58, is shut off. Substantially simultaneously, the rotation of rollers 32, 34 and brushes 26, 28 is stopped. Door 27 over slot 24 is opened, robotic arm 10 inserts end-effector 11 into slot 24 and the end-effector 11 engages wafer 64. Then, Brushes 26, 28 are moved back to positions 66, 68, respectively, and robotic arm 10 removes wafer 64. Wafer cleaner 14 is now ready to process another wafer.

As described in Jones et al., U.S. application Ser. No. 09/113,811, cofiled herewith and incorporated herein by reference in its entirety, wafer 64 can be held in place during loading/unloading by a finger and can also have its edge scrubbed simultaneous with surfaces 74, 76.

Referring to FIG. 1, by using two wafer cleaners 14, 16, sequentially, a wafer can be scrubbed and rinsed with two different solutions. In one embodiment, for example, the scrubbing liquid in wafers cleaner 14 is an ammonia solution or a surfactant available from Valtec or Allied. The scrubbing liquid in wafer cleaner 16 is de-ionized water. This arrangement is particularly advantages since surfactant residue on the wafer from wafer cleaner 14 is readily removed by the water rinse in wafer cleaner 16. However in alternative embodiments, other scrubbing liquids are used, for example acid or caustic solutions are used in either wafer cleaner 14 or 16. Further, it is understood that only a single wafer cleaner can be used, or that several wafer cleaners can be used.

Referring again to FIG. 2, as the art moves to larger diameter wafers, e.g. 300 millimeter (mm) diameter wafers, the length of brushes 26, 28 is correspondingly increased, where the length is measured along the longitudinal axis from ends 230, 232 to ends 234, 236 of brushes 26, 28, respectively. To flush this greater brush length from the inside out with a sufficient amount of liquid, a greater amount of liquid must be provided from rotary unions 41, 43 to the central cavities of shaft 40, 42 and to brushes 26, 28, respectively, than with shorter length brushes.

As set forth above, shafts 40, 42 have perforations in the regions where brushes 26, 28 are mounted to shafts 40, 42, respectively. Typically, brushes 26, 28 are mounted to shafts 40, 42, by mandrel assemblies, i.e. brushes 26, 28 are mounted to mandrel assemblies which are mounted to shafts 40, 42, respectively. Perforations in shafts 40, 42 and the mandrel assemblies allow liquid to be distributed from shafts 40, 42 to brushes 26, 28, respectively. However, as the length of brushes 26, 28 becomes greater to accommodate larger diameter wafers, the flow of liquid to brushes 26, 28 may become non-uniform. In particular, as the length of brushes 26, 28 increases, a pressure drop within shafts 40, 42 may exist from ends 234, 236 to ends 230, 232 of brushes 26, 28, respectively. This pressure drop, in turn, causes a greater amount of liquid to pass through perforations in shafts 40, 42 near ends 234, 236 of brushes 26, 28 than near ends 230, 232 of brushes 26, 28, respectively. This nonuniform flushing of brushes 26, 28 can cause various undesirable effects such as insufficient particulate removal near ends 230, 232 of brushes 26, 28, or uneven wear of brushes 26, 28.

In addition to the difficulty of providing a uniform flow to brushes 26, 28, as the length of brushes 26, 28 increases it also becomes increasingly difficult to prevent localized nonuniform flushing of brushes 26, 28. To illustrate, assume the case where the length of brushes 26, 28 increases but the overall number of perforations in shafts 40, 42 and the associated mandrel assemblies remains the same. In this case, the distance between adjacent perforations correspondingly increases. Accordingly, the portions of brushes 26, 28 proximate a perforation receives a large amount of liquid flow but the portions located between adjacent perforations receives a significantly reduced liquid flow. Thus, the portions of brushes 26, 28 between adjacent perforations may not be flushes sufficiently to remove undesirable particulates.

To reduce localized nonuniform flushing of brushes 26, 28, the number of perforations can be increased. However, increasing the number of perforations correspondingly increases the liquid flow resulting in a larger overall amount of liquid which must be filtered and otherwise handled. To reduce the overall amount of liquid which must be handled, the diameter of the perforations can be reduced. However, there are practical manufacturing limitations which limit the minimum diameter of the perforations. Accordingly, an improved brush assembly is needed which reduces or eliminates end-to-end and localized liquid flow nonuniformities without substantially increasing the overall amount of liquid which must be handled.

Figure 7:
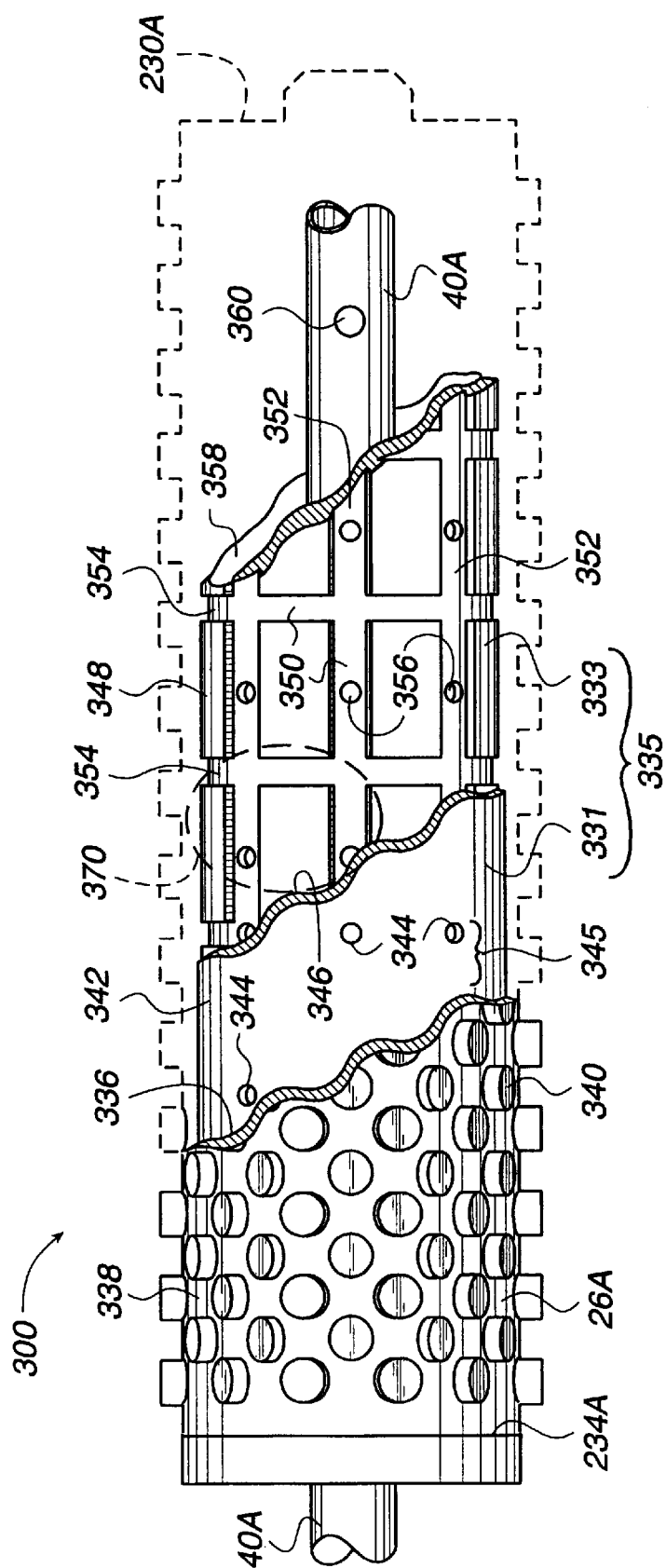
FIG. 7 is a side view, partially cutaway, of a brush assembly which provides a desired liquid flow distribution in accordance with the present invention.

FIG. 7 is a side view, partially cutaway, of a brush assembly 300 which provides a desired liquid flow distribution in accordance with the present invention. Brush assembly 300 includes a brush 26A mounted on an outer mandrel housing 331. Located within housing 331 is an inner mandrel flow distributor 333. Distributor 333 in combination with housing 331 form mandrel assembly 335. Within distributor 333 is a shaft 40A. In FIG. 7, brush 26A, housing 331, distributor 333 and shaft 40A are partially, cutaway for purposes of clarity and discussion.

Brush 26A is formed of a permeable material such as PVA foam, nylon, mohair or polishing pad material to allow liquid to readily pass from the inner surface 336 to the outer surface 338 of brush 26A. Outer surface 338 includes a plurality of protuberances 340 which, during use, contact and scrub the wafer. Illustratively, housing 331 and distributor 333 are polyvinylidene fluoride (PVDF) and shaft 40A is 316 stainless steel although it is understood that other materials can be used.

Inner surface 336 of brush 26A forms a pressure fit with outer surface 342 of housing 331. Housing 331 includes a plurality of perforations 344 which extend from inner surface 346 to outer surface 342 of housing 331. During use, liquid is supplied from inside of housing 331 through perforations 344 to brush 26A.

Inner surface 346 of housing 331 abuts outer surface 348 of distributor 333. Outer surface 348 of distributor 333 has a slot matrix 350 formed therein. As shown in FIG. 7, slot matrix 350 includes a plurality of longitudinal slots 352 parallel to the longitudinal axis of distributor 333 and plurality of annular slots 354 circling distributor 333 perpendicular to the longitudinal axis of distributor 333. Each annular slot 354 corresponds with a radial column 345 of perforation 344 in housing 331 as further described below. Further, located between adjacent annular slots 354 in each longitudinal slot 352 is a perforation 356 extending from inner surface 358 of distributor 333 to the associated longitudinal slot 352. During use, liquid is supplied from inside distributor 333 though perforations 356 to longitudinal slots 352. The liquid flows in longitudinal slots 352 to annular slots 354. From annular slots 354, liquid is provided through perforations 344 in housing 331 to brush 26A.

Located within distributor 333 is shaft 40A. Shaft 40A includes a plurality of perforations 360. During use, liquid provided to shaft 40A from a rotary union (e.g. see rotary unions 41, 43 of FIG. 2) flows from the cavity inside of shaft 40A through perforations 360. The liquid flows through distributor 333, through housing 331 and to brush 26A. As discussed further below, distributor 333 redistributes the flow of liquid between shaft 40A and housing 331 by causing the liquid to flow through longitudinal slots 352 and annular slots 354, i.e. through slot matrix 350.

Figures 8, 9:
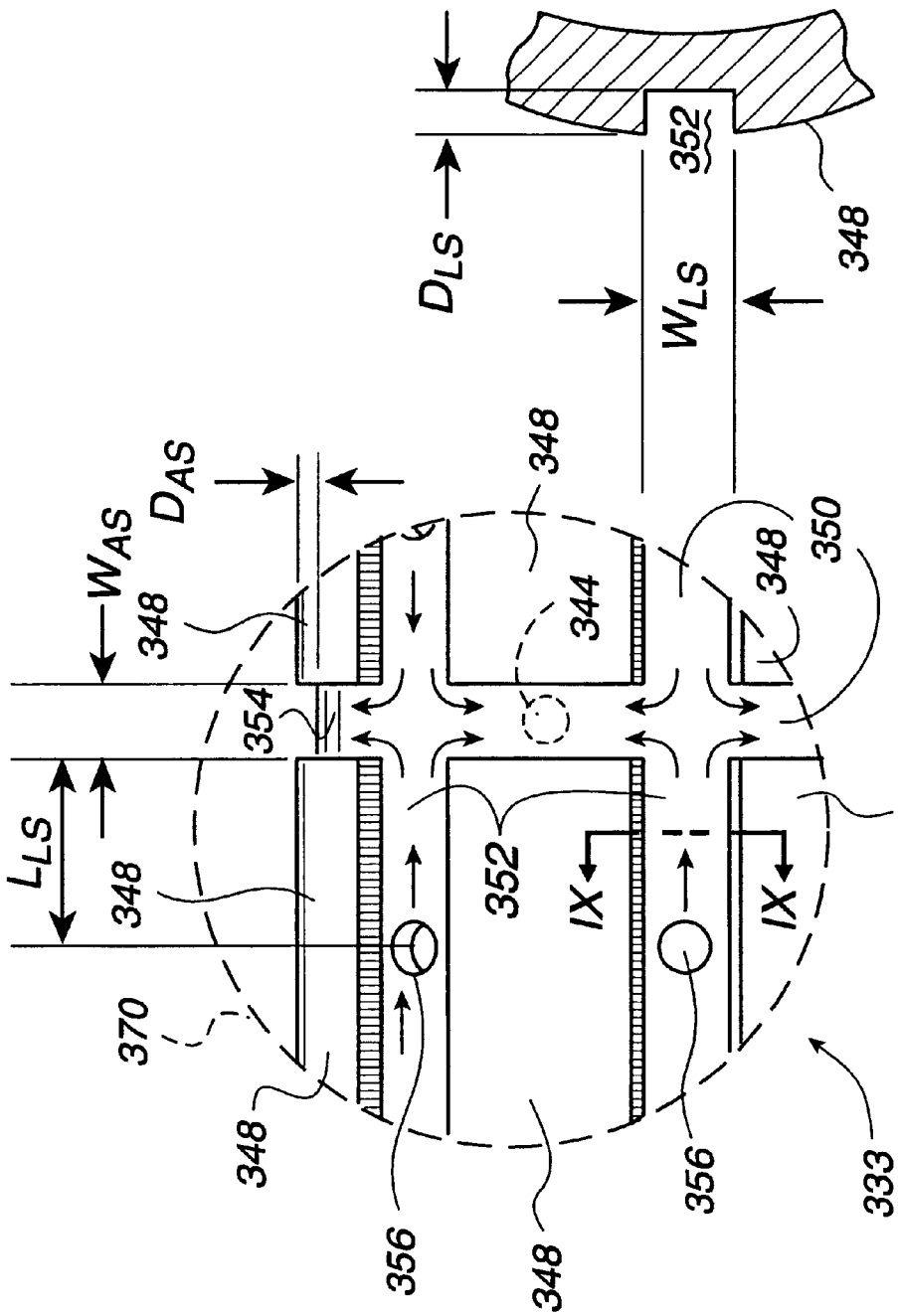
FIG. 8 is a side view of a region of the distributor of FIG. 7 in accordance with the present invention.
FIG. 9 is a cross-sectional view of the distributor along the line IX—IX of FIG. 8 in accordance with the present invention.

FIG. 8 is a side view of a region 370 of distributor 333 of FIG. 7 in accordance with the present invention. As set forth above, during use liquid flows through perforations 356 and into longitudinal slots 352. Since outer surface 348 of distributor 333 abuts inner surface 346 of housing 331 (see FIG. 7), liquid exiting perforations 356 is contained in longitudinal slots 352 and generally in slot matrix 350. (A small amount of liquid may leak between outer surface 348 of distributor 333 and inner surface 346 of housing 331 but for practical purposes this leakage is negligible.)

As indicated by the arrows in FIG. 8, liquid flows from each perforation 356 through the associated longitudinal slot 352 to the adjacent annular slot 354. At annular slot 354, the liquid flow is diverted from longitudinal slot 352 into annular slot 354 by an opposite flow of liquid through the particular longitudinal slot 352 from the adjacent perforation 356. The liquid then flows through annular slot 354 to and through perforations 344 in housing 331 (the location of a single perforation 344 is indicated by the dashed circle in FIG. 8).

Of importance, the flow of liquid from perforations 356 in distributor 333 to perforations 344 in housing 331 is readily controlled by appropriately selecting the number and dimensions of longitudinal slots 352 and annular slots 354. In particular, by appropriately selecting the cross-sectional area and, to a lesser extent, the length of longitudinal slots 352 and annular slots 354, the liquid flow is controlled. For example, a greater liquid flow can selectively be provided to one slot over another slot, or to a first portion of a slot over a second portion of the slot, by appropriately selecting the dimensions of the slot(s). Generally, increasing the cross-sectional area and, to a lesser extent, decreasing the length of a slot increases the flow of liquid through that particular slot and vice versa.

As illustrated in FIG. 8, annular slot 354 has a depth $D_{AS}$ and a width $W_{AS}$. By increasing (decreasing) depth $D_{AS}$ and/or width $W_{AS}$, the resistance to liquid flow through annular slot 354 is decreased (increased) and, correspondingly, the amount of liquid which flows to perforation 344 in housing 331 is increased.

FIG. 9 is a cross-sectional view of distributor 333 along the line IX—IX of FIG. 8 in accordance with the present invention. As shown in FIG. 9, longitudinal slot 352 has a depth $D_{LS}$ and a width $W_{LS}$. By increasing (decreasing) depth $D_{LS}$ and/or width $W_{LS}$, the resistance to liquid flow through longitudinal slot 352 is decreased (increased) and, correspondingly, the amount of liquid which flows to perforation 344 in housing 331 is increased. Further, although the flow through longitudinal slot 352 is primarily determined by the cross-sectional area, the resistance to liquid flow through longitudinal slot 352 can be decreased (increased) to some extent by decreasing (increasing) the length $L_{LS}$ of longitudinal slot 352 between perforation 356 and annular slot 354 (see FIG. 8).

Figure 10:
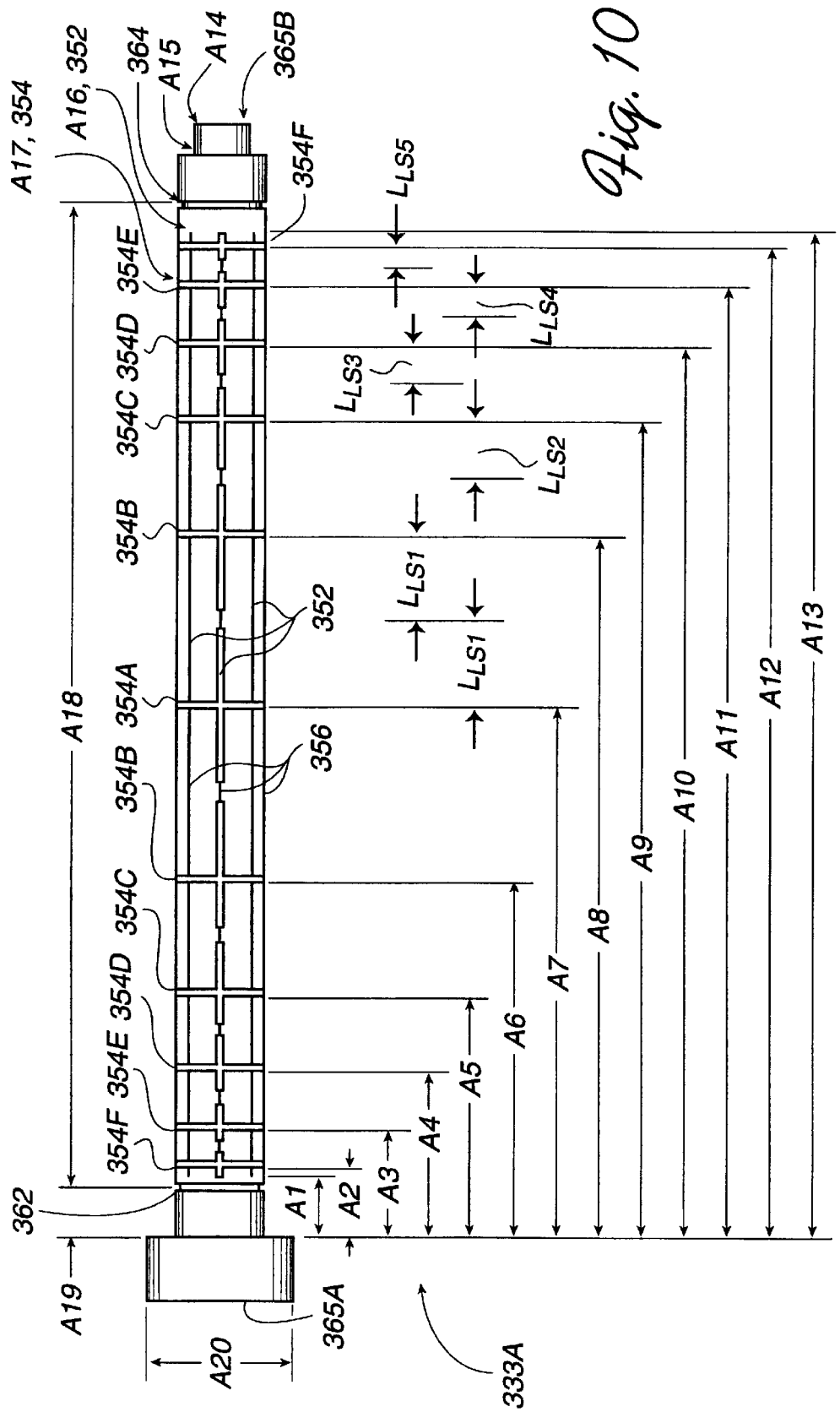
FIG. 10 is a side view of a distributor in accordance with one embodiment of the present invention.

FIG. 10 is a side view of distributor 333A in accordance with one embodiment of the present invention. Referring to FIGS. 7 and 10, since a radial column 345 of perforations 344 in housing 331 is associated with each annular slot 354A–354F and annular slots 354A–354F are closer to one another near ends 365A, 365B of distributor 333A, a greater number of perforation 344 per unit area of housing 331 is provided near the ends of the brush assembly. Accordingly, a greater amount of liquid is provided to clean the wafer near the ends of the brush assembly where a greater effective wafer surface area must be cleaned than at the center.

By causing the liquid to flow through longitudinal slots 352 and annular slots 354A–354F to reach perforations 344, the liquid flow to perforations 344 is restricted. This allows a large number of perforations 344 to be used, e.g. eight perforations 344 per radial column 345, to be used without a significant increase in the overall amount of liquid used. Further, by using distributors with longitudinal slots 352 and annular slots 354A–354F having different cross-sectional areas, the overall amount of liquid can readily be controlled. As an illustration, a first distributor having longitudinal slots 352 and annular slots 354A–354F with greater cross-sectional areas than those of a second distributor will allow a greater amount of liquid to flow from shaft 40A to housing 331 than the second distributor.

Further, by restricting the flow of liquid, distributor 333A causes a uniform pressure buildup inside of distributor 333A. This, in turn, ensures that both ends 230A, 234A of brush 26A receive the same amount of liquid improving particulate removal from brush 26A and reducing or eliminating uneven wear of brush 26A. Thus, brush assemblies in accordance with the present invention are well suit for use in wafer cleaners such as the wafer cleaner illustrated in FIG. 2.

Illustrative specifications for the various characteristics of distributor 333A shown in FIG. 10 are set forth below in Table 1. In the tables which follow, dimensions are in inches unless otherwise indicated.

TABLE 1

| | |
|---|---|
| A1 | 8X .78 |
| A2 | .91 |
| A3 | 1.41 |
| A4 | 2.16 |
| A5 | 3.16 |
| A6 | 4.66 |
| A7 | 6.91 |
| A8 | 9.16 |
| A9 | 10.66 |
| A10 | 11.66 |
| A11 | 12.41 |
| A12 | 12.91 |
| A13 | 8X 13.10 |
| A14 | ¾-16 UNF-2A |
| A15 | Min Thread Relief Permissible |
| A16 | 8X @ 45° .062 × .011 Deep Longitudinal Slot |
| A17 | 10X .062 × .011 Deep Annular Slot |
| A18 | 12.90 |
| A19 | .60 |
| A20 | ⌀2.00 |

As set forth in Table 1, annular slots 354A, 354B, 356C, 354D, 354E, 354F and longitudinal slots 352 have equal depths $D_{AS}$, $D_{LS}$ and equal widths $W_{AS}$, $W_{LS}$, respectively. Accordingly, the resistance to liquid flow and thus the liquid flow through annular slots 354A, 354B, 356C, 354D, 354E, 354F and longitudinal slots 352 for any given length of the particular slot is approximately equal. However, to some extent the liquid flow is affected by the length $L_{LSi}$ (i=1 through 5 in this embodiment) through longitudinal slot 352 which the liquid must flow, where length $L_{LSi}$ is the length between a perforation 356 and the corresponding annular slot 354A, 354B, 354C, 354D, 354E, 354F. Of importance, this length $L_{LSi}$ varies to provide a somewhat greater flow of liquid to annular slots 354E, 354F near ends 365A, 365B of distributor 333A than annular slot 354A near the center of distributor 333A.

In particular, length $L_{LS1}$ between perforations 356 and annular slots 354A, 354B is greatest with distances $L_{LS2}$, $L_{LS3}$, $L_{LS4}$ respectively decreasing to the minimum length $L_{LS5}$. Thus, the greatest resistance to liquid flow (and the least amount of liquid flow) is to annular slot 354A with the resistances to annular slots 354B, 354C, 354D respectively decreasing (and the liquid flow respectively increasing) to the minimum resistance (and the greatest liquid flow) to annular slots 354E, 354F. Thus, the spacing of annular slots 354A–354F further ensures that a greater amount of liquid is provided to clean the wafer near the ends of the brush assembly where a greater effective wafer surface area must be cleaned than at the center.

FIG. 11 is a cross-sectional view of distributor 333A of FIG. 10 in accordance with this embodiment of the present invention. Illustrative specifications for the various characteristics of distributor 333A shown in FIG. 11 are set forth below in Table 2.

TABLE 2

| | |
|---|---|
| B1 | .200 |
| B2 | .750 |
| B3 | 1.19 |
| B4 | 1.81 |
| B5 | 2.69 |
| B6 | 3.94 |
| B7 | 5.81 |
| B8 | 8.06 |
| B9 | 9.94 |
| B10 | 11.19 |
| B11 | 12.06 |
| B12 | 12.69 |
| B13 | 80X Ø.062 Thru O.C. of Longitudinal Slots |
| B14 | Ø1.125 |
| B15 | .39 |
| B16 | (2X)Ø1.025 × .093 Groove |
| B17 | Ø1.010 × .187 Groove |
| B18 | 13.75 |
| B19 | 14.120 |
| B20 | 15.39 REF |
| B21 | .87 |
| B22 | .82 |
| B23 | Ø1.750 |
| B24 | Ø1.313 |

As shown in FIG. 11, distributor 333A has an O-ring groove 398 in inner surface 358A in which an O-ring is seated to form a seal between shaft 40A (not shown) and distributor 333A. In this manner, liquid is prevented from leaking out of distributor 333A at end 365A.

FIGS. 12 and 13 are plan views of distributor 333A taken from ends 365A, 365B, respectively, of FIG. 10 in accordance with this embodiment of the present invention. Illustrative specifications for the various characteristic shown in FIGS. 12 and 13 are set forth in Table 3 below.

TABLE 3

| | |
|---|---|
| C1 | Ø.755 |
| C2 | 4X 2-56 UNC-2B .25 Min Full Thd On Ø1.500 B.C. |
| D1 | Ø.501 Thru |

Figure 14:
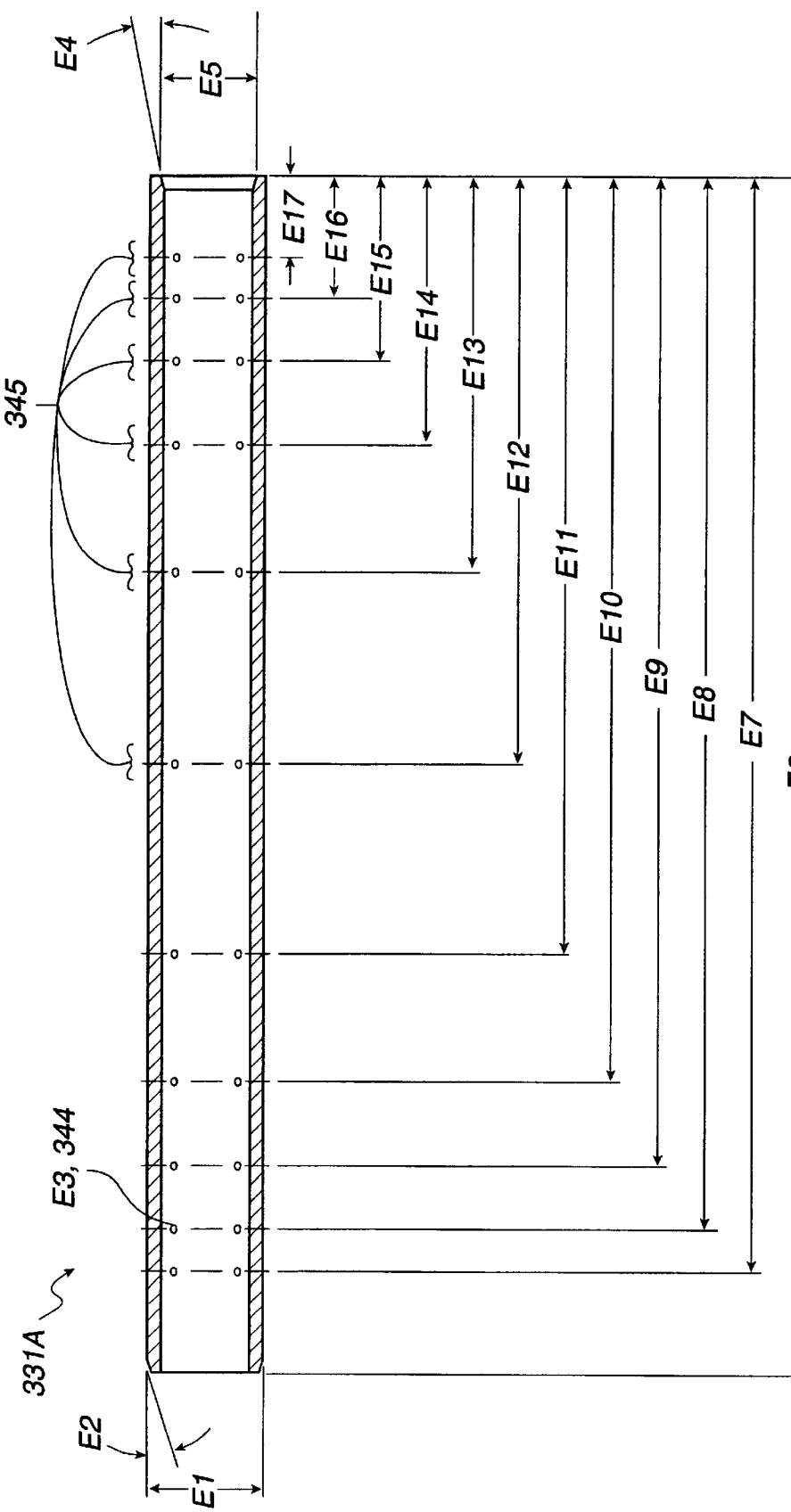
FIG. 14 is a cross-sectional view of a housing for use with the distributor of FIGS. 10–13 in accordance with this embodiment of the present invention.

FIG. 14 is a cross-sectional view of a housing 331A for use with distributor 333A of FIGS. 10–13 in accordance with this embodiment of the present invention. Illustrative specifications for the various characteristic of housing 331A shown in FIG. 14 are provided in Table 4 below.

TABLE 4

| | |
|---|---|
| E1 | Ø1.375 |
| E2 | 20° All Around |
| E3 | (88X) Ø.062 Holes Thru |
| E4 | 15° All Around |
| E5 | Ø1.20 |
| E6 | 14.130 |
| E7 | 12.94 |
| E8 | 12.44 |

TABLE 4-continued

| | |
|---|---|
| E9 | 11.69 |
| E10 | 10.69 |
| E11 | 9.19 |
| E12 | 6.94 |
| E13 | 4.69 |
| E14 | 3.19 |
| E15 | 2.19 |
| E16 | 1.44 |
| E17 | .94 |

FIG. 15 is a cross-sectional view of housing 331A of FIG. 14 mounted on distributor 333A of FIGS. 10–13 in accordance with this embodiment of the present invention. Illustrative specifications for the various characteristics shown in FIG. 15 are provided in Table 5 below.

TABLE 5

| | |
|---|---|
| F1 | Flush |
| F2 | .42 |
| F3 | Ø.125 PVDF Pins Thru Both Sides. |
| F4 | Ø.755 |
| F5 | Internal Chamfer On Distributor 331A To Feed Over Housing 333A And O-Ring 368 To Rest Position Shown. Holes (88X) In Distributor 331A To Be Positioned +11.25° Or −11.25° From Holes (80X) In Housing 333A. |
| F6 | 0-Ring 1" ID 1⅛" OD BUNA |
| F7 | 13.94 |

As illustrated in FIGS. 10, 11 and 15, distributor 333A has O-ring grooves 362, 364 in which O-rings 366, 368, respectively, are placed. O-rings 366, 368 form a seal between housing 331A and distributor 333A which prevents liquid flowing between housing 331A and distributor 333A from leaking out at the ends. Further, referring to FIG. 15, housing 331A and distributor 333A have mounting holes 371 through which pins 374 are inserted to fixedly mount housing 331A on distributor 333A.

FIG. 16 is a cross-sectional view of housing 331A and distributor 333A along the line XVI—XVI of FIG. 15 in accordance with this embodiment of the present invention. As shown in FIG. 16, perforations 344 in housing 331A are radially offset from perforations 356 in distributor 333A. Further, this radial offset changes in adjacent radial columns 345 of perforations 344. Illustratively, the radial offset $Ø_1$ between perforations 356 in distributor 333A and perforations 344 of a first radial column 345 in housing 331A is 11.25° and the radial offset $Ø_2$ between perforations 356 and perforations 344A of a second radial column 345 in housing 331A is 33.75°. By having radial columns 345 of perforations 344 offset from one another, liquid distribution and flushing of the brush (not shown) mounted on housing 331A is enhanced.

FIG. 17 is a plan view of housing 331A and distributor 333A of FIG. 15 taken from end 365B in accordance with this embodiment of the present invention. An illustrative specification for the feature shown in FIG. 17 is provided in Table 6 below.

TABLE 6

| | |
|---|---|
| G1 | Ø1.375 |

FIG. 18 is an exploded perspective view of a brush assembly 300A without brush 26A in accordance with this embodiment of the present invention. As shown in FIG. 18, end 365B of mandrel assembly 335A is sealed with an O-ring 380 and cap 382. Generally, cap 382 threads on end 365B and compresses O-ring 380 against a flat seal surface 384 of mandrel assembly 335A. In this manner, liquid is prevented from leaking out of end 365B of mandrel assembly 335A.

As described above in reference to FIG. 11, mandrel assembly 335A forms a seal with shaft 40A (not shown) by an O-ring 386 shown in FIG. 18. Mandrel assembly 335A is engaged to shaft 40A by a hub 388 which is mounted to mandrel assembly 335A with screws 390. As further described below, pins in shaft 40A are seated in slots 392 in hub 388 by a spring washer 394 and washer 396, where spring washer 394 provides a spring force between a lip 400 (see FIG. 11) of distributor 333A and the pins in shaft 40A.

Figure 19:
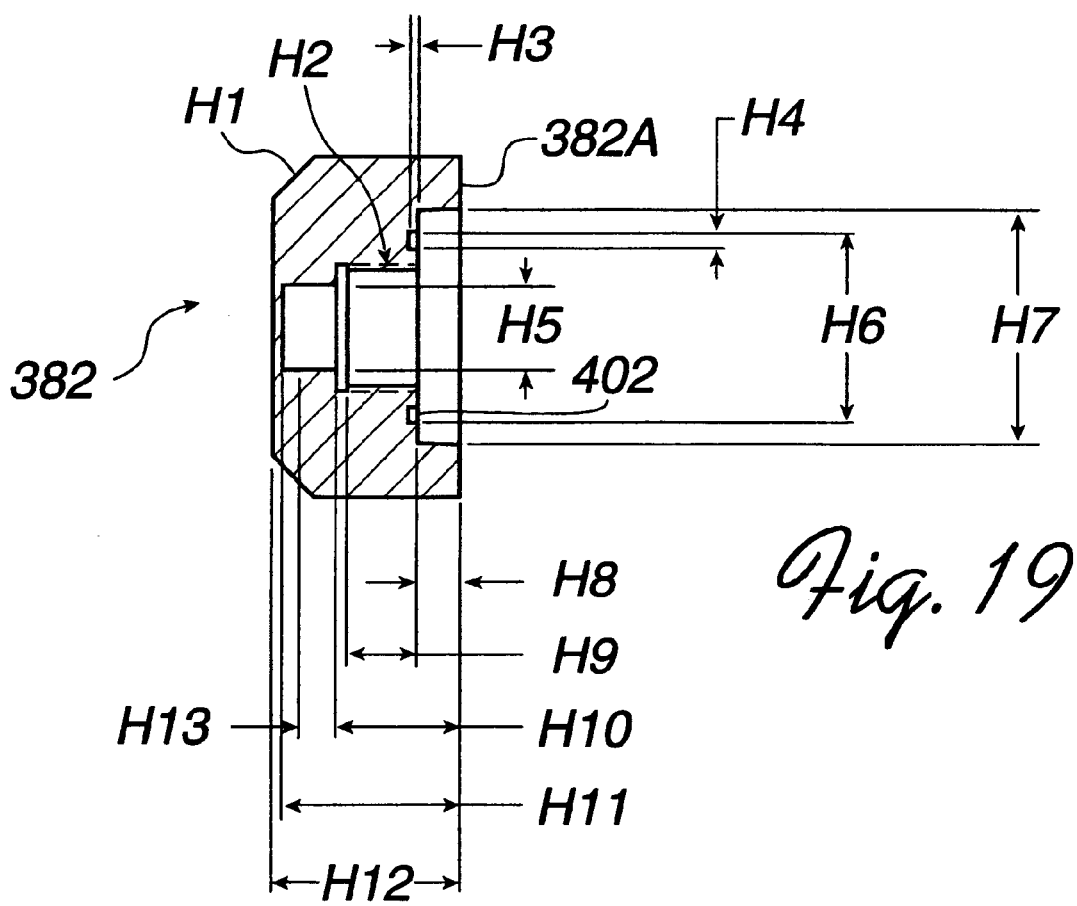
FIG. 19 is a cross-sectional view of a cap in accordance with this embodiment of the present invention.

FIG. 19 is a cross-sectional view of cap 382 in accordance with this embodiment of the present invention. Illustrative specifications for the various characteristics of cap 382 shown in FIG. 19 are provided in Table 7 below.

TABLE 7

| | |
|---|---|
| H1 | .25 X .25 BRK All Around |
| H2 | ¾-16 UNF-2B |
| H3 | .050 |
| H4 | .101 |
| H5 | ⌀.501 |
| H6 | ⌀1.125 |
| H7 | ⌀1.376 |
| H8 | .250 |
| H9 | .437 Min Full Thd |
| H10 | .737 Max |
| H11 | 1.062 |
| H12 | 1.125 |
| H13 | .23 |

As shown in FIG. 19, cap 382 has an O-ring groove 402 in which O-ring 380 (see FIG. 18) is seated.

Figure 20:
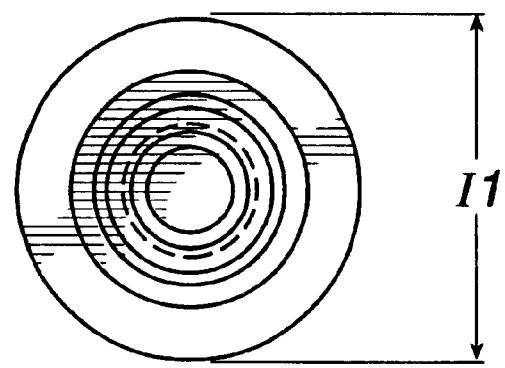
FIG. 20 is an end view of the cap of FIG. 19 in accordance with this embodiment of the present invention.

FIG. 20 is a end view of cap 382 taken from end 382A of FIG. 19 in accordance with this embodiment of the present invention. An illustrative specification for the characteristic illustrated in FIG. 20 is provided in Table 8 below.

TABLE 8

| | |
|---|---|
| I1 | ⌀2.00 |

Figure 21:
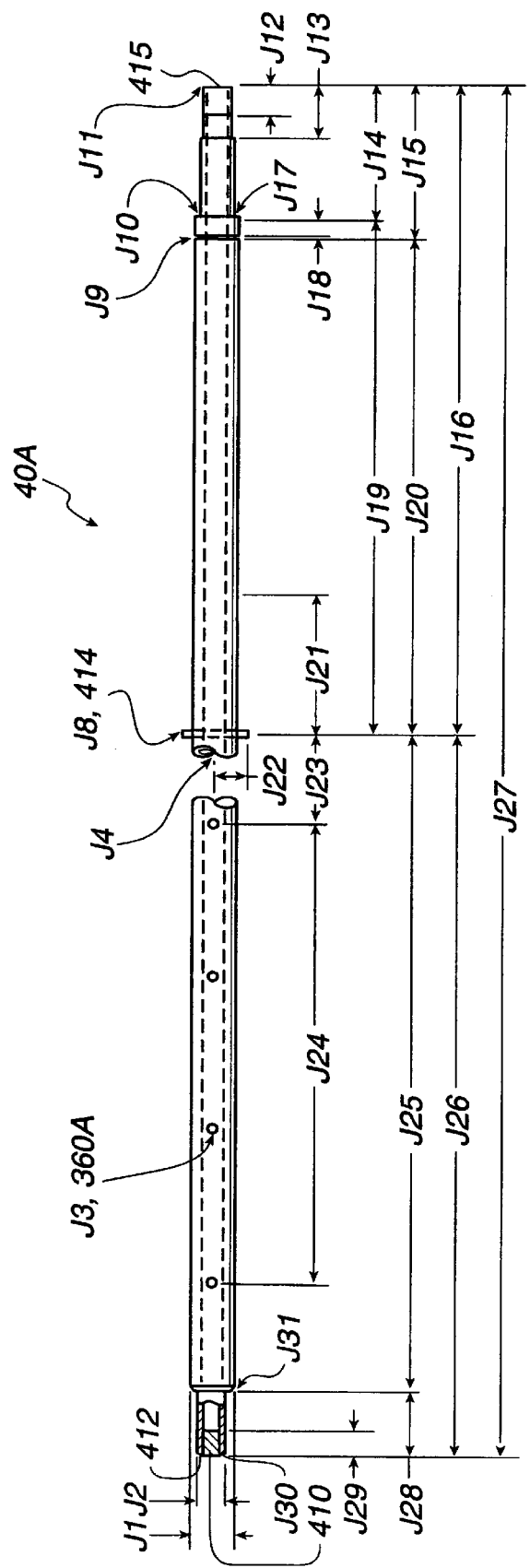
FIG. 21 is a side view, partially cross-sectioned, of a shaft in accordance with this embodiment of the present invention.

FIG. 21 is a side view, partially cross-sectioned, of shaft 40A in accordance with this embodiment of the present invention. Illustrative specifications for the various characteristic of shaft 40A shown in FIG. 21 are provided in Table 9 below.

TABLE 9

| | |
|---|---|
| J1 | .7495 |
| J2 | ⌀.500 |
| J3 | 4X ⌀.19 Thru Both Walls |
| J4 | ⌀.31 Clear Thru Part |
| J8 | ⌀.125 x 1.062 Lg 300 Series SS Dowel Pins - .03 Annular Corner RADII Both Ends. PF In Shaft. Pin Must Not Be Magnetic. |
| J9 | ⌀.704 x .050 WD Annular Groove |
| J10 | .02–.03 Brk |
| J11 | ¼ NTP |
| J12 | .50 |
| J13 | 1.00 |
| J14 | 2.558 |
| J15 | 3.006 |
| J16 | 12.714 Ref |
| J17 | 2X R.015–.025 |
| J18 | .41 |
| J19 | 10.16 Ref |
| J20 | 9.708 |
| J21 | 3.00 |

TABLE 9-continued

| | |
|---|---|
| J22 | .531 |
| J23 | 3.15 |
| J24 | 9.00 |
| | 3 Spaces Equally Divided |
| J25 | 14.339 |
| J26 | 15.626 |
| J27 | 28.341 Ref |
| J28 | 1.287 Ref |
| J29 | .50 |
| J30 | PF SS Plug |
| J31 | 2X.10 x 20° |

As shown in FIG. 21, shaft 40A is hollow and has a plug 410 which seals end 412 of shaft 40A. The opposite end 415 of shaft 40A is threaded to allow attachment of a rotary union (e.g. see rotary union 41 of FIG. 2). Further, extending through shaft 40A is a pin 414. Pin 414 is seated in slots 392 of hub 388 (see FIG. 18). During use, shaft 40A is rotated by a motor (e.g. see motor 44 of FIG. 2). Referring now to FIGS. 18 and 21, since pin 414 is engaged with hub 388, rotation of shaft 40A causes brush assembly 300A to rotate.

Figure 22:
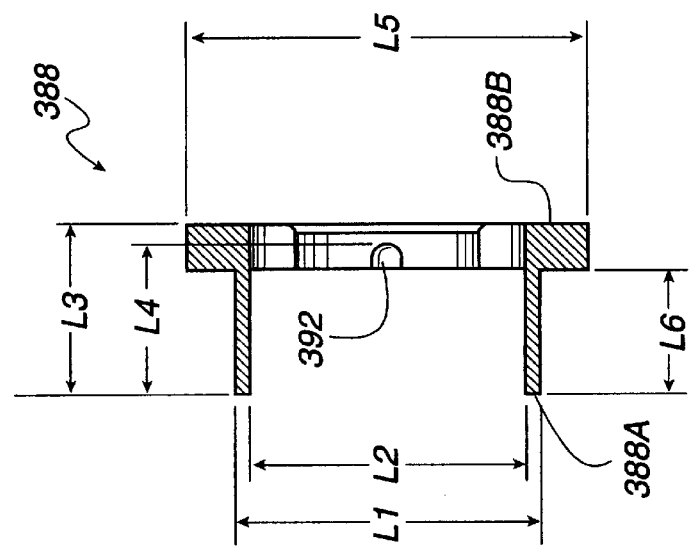
FIG. 22 is a cross-sectional view of a hub in accordance with this embodiment of the present invention.

FIG. 22 is a cross-sectional view of hub 388 in accordance with this embodiment of the present invention. Illustrative specifications for the various characteristics of hub 388 shown in FIG. 22 are provided in Table 10 below.

TABLE 10

| | |
|---|---|
| L1 | ⌀1.312 |
| L2 | ⌀1.188 |
| L3 | .740 |
| L4 | .642 |
| L5 | ⌀1.740 |
| L6 | 2X .540 |

Figure 23:
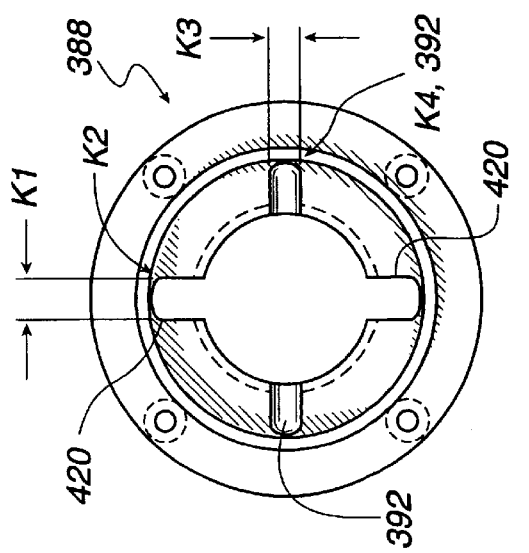

FIG. 23 is a plan view from end 388A of hub 388 of FIG. 22 in accordance with this embodiment of the present invention. Illustrative specifications for the various characteristics of hub 388 shown in FIG. 23 are provided in Table 11 below.

TABLE 11

| | |
|---|---|
| K1 | 2X .188 Slot Thru |
| K2 | 2X Full R Max |
| K3 | 2X .126 |
| K4 | 2X Full spherical |

As shown in FIG. 23, hub 388 has two through-slots 420. Referring to FIGS. 21 and 23, hub 388 can be inserted over end 412 of shaft 40A and slid along the length of shaft 40A to pin 414. Pin 414 then fits through through-slots 420. Hub 388 is then rotated 90° and slid back towards end 412 to engage pin 414 is slots 392.

Figure 24:
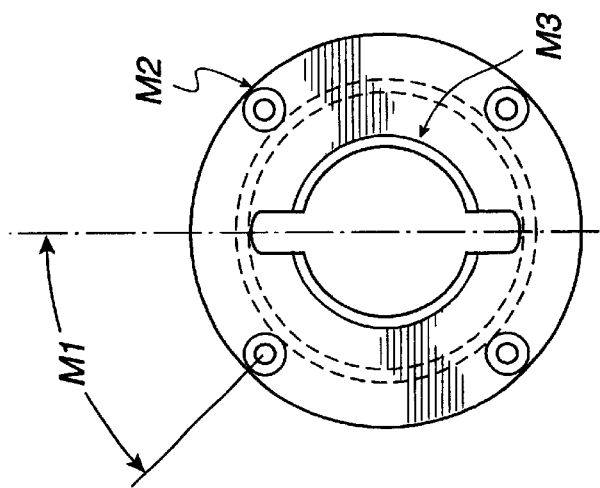
FIGS. 23 and 24 are end plan views of the hub of FIG. 22 in accordance with this embodiment of the present invention.

FIG. 24 is a plan view from end 388B of hub 388 of FIG. 22 in accordance with this embodiment of the present invention. Illustrative specifications for the various characteristics of hub 388 shown in FIG. 24 are provided in Table 12 below.

TABLE 12

| | |
|---|---|
| M1 | 45° |
| M2 | 4X ⌀.104 Thru C'SK ⌀.180 x 82° On ⌀1.500 B.C. |
| M3 | ⌀.752 |
| | .03 x 45° Brk |

Although the present invention has been described with reference to various embodiments, persons skilled in the art will recognize that changes may be made in form and detail without departing from the spirit and scope of the invention. For example, the wafer can be a generally circular silicon wafer, glass wafer, ceramic wafer, oxide wafer, tungsten wafer although other types of wafers can be used. Further, although various values, materials and dimensions have been provided, it is understood that these values, materials and dimensions are only illustrative and not limiting and that other values, materials and dimension can be used. For example, instead of slots having rectangular cross-sections, slots having other cross-sectional shapes such as semicircular slot can be used. Further, although various liquids have been set forth, it is understood that substantially any liquid or chemical can be used with a wafer cleaner and brush assembly in accordance with the present invention. For example, various alcohols, surfactants, ammonia based solutions, buffer solutions, high PH solutions and low PH solutions can be used. Thus, the invention is limited only by the following claims.

We claim:

1. A brush assembly used for cleaning wafers comprising:
   a distributor having a slot matrix formed in an outer surface thereof, the distributor being elongated and having at least one perforation, the slot matrix including at least one longitudinal slot and at least one annular slot;
   a housing having an interior portion and an exterior portion, the housing comprising at least one housing perforation, the interior portion being configured to abut the distributor; and
   a brush mounted on the exterior portion of the housing;
   wherein the distributor implements the at least one longitudinal slot and the at least one annular slot of the slot matrix to evenly supply fluid through the housing to the brush to allow consistent fluid distribution over a surface of the brush.

2. The brush assembly used for cleaning wafers of claim 1 wherein said at least one distributor perforation is located in said at least one longitudinal slot, said at least one distributor perforation extending from an inner surface of said distributor to said at least one longitudinal slot.

3. The brush assembly used for cleaning wafers of claim 1 wherein there are a plurality of housing perforations, said housing includes at least one radial column of said housing perforations corresponding to said at least one annular slot.

4. The brush assembly used for cleaning wafers of claim 3 wherein said at least one longitudinal slot has said at least one distributor perforation therein.

5. The brush assembly used for cleaning wafers of claim 4 wherein, during use, liquid flows from said at least one distributor perforation through said at least one longitudinal slot to said at least one annular slot.

6. The brush assembly used for cleaning wafers of claim 5 wherein said liquid flow is controlled by the cross-sectional area and length of said at least one longitudinal slot.

7. The brush assembly used for cleaning wafers of claim 5 wherein said at least one longitudinal slot comprising a first longitudinal slot and a second longitudinal slot, wherein said at least one distributor perforation comprises a first distributor perforation in said first longitudinal slot and a second distributor perforation in said second longitudinal slot, and wherein said at least one annular slot comprises a first annular slot.

8. The brush assembly used for cleaning wafers of claim 7 wherein said first longitudinal slot and said second longitudinal slot have equal cross-sectional areas, a first distance between said first distributor perforation and said first annular slot being greater than a second distance between said second distributor perforation and said first annular slot.

9. The brush assembly used for cleaning wafers of claim 8 wherein the flow of liquid from said second distributor perforation through said second longitudinal slot to said first annular slot is greater than the flow of liquid from said first distributor perforation through said first longitudinal slot to said first annular slot.

10. The brush assembly used for cleaning wafers of claim 7 wherein said first distributor perforation and said second distributor perforation are equally spaced from said first annular slot, said first longitudinal slot having a greater cross-sectional area than said second longitudinal slot.

11. The brush assembly used for cleaning wafers of claim 10 wherein the flow of liquid from said second distributor perforation through said second longitudinal slot to said first annular slot is less than the flow of liquid from said first distributor perforation through said first longitudinal slot to said first annular slot.

12. A brush assembly comprising:
    a distributor having a slot matrix formed in an outer surface thereof, the distributor being elongated in a direction and having a plurality of perforations, the slot matrix including a plurality of longitudinal slots oriented in the direction and a plurality of annular slots that are perpendicular to each of the plurality of longitudinal slots and spaced from each other along the direction;
    a housing having an inner surface abutting said outer surface of said distributor;
    a brush mounted on said housing; and
    a shaft, said distributor being mounted on said shaft;
    wherein liquid is transported from the shaft through the distributor after which the distributor implements the longitudinal and annular slots of the slot matrix to evenly supply fluid through the housing to the brush to allow consistent fluid distribution over a surface of the brush.

13. The brush assembly of claim 12 wherein said brush comprises a permeable material.

14. The brush assembly of claim 13 wherein said brush is selected from the group consisting of polyvinyl alcohol foam, nylon, mohair and polishing pad material.

15. The brush assembly of claim 12 wherein, during use, liquid flow between said distributor and said housing is contained to said slot matrix.

16. The brush assembly of claim 12 wherein said shaft has a central cavity and perforations in the region where said brush is mounted to said housing.

17. A brush assembly comprising:
    a distributor having a slot matrix formed in an outer surface thereof, the distributor being elongated in a direction and having a plurality of perforations, the slot matrix including a plurality of longitudinal slots oriented in the direction and a plurality of annular slots that are perpendicular to each of the plurality of longitudinal slots and spaced from each other along the direction;
    a housing having an inner surface abutting said outer surface of said distributor; and
    a brush mounted on said housing.

18. The brush assembly of claim 17, further comprising:
    a shaft, said distributor being mounted on said shaft; and
    wherein liquid is transported from the shaft through the distributor after which the distributor implements the longitudinal and annular slots of the slot matrix to evenly supply fluid through the housing to the brush to allow consistent fluid distribution over a surface of the brush.

* * * * *